(12) United States Patent
Saito

(10) Patent No.: US 7,605,423 B2
(45) Date of Patent: Oct. 20, 2009

(54) SEMICONDUCTOR DEVICE

(75) Inventor: Wataru Saito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 452 days.

(21) Appl. No.: 11/612,723

(22) Filed: Dec. 19, 2006

(65) Prior Publication Data
US 2007/0138543 A1 Jun. 21, 2007

(30) Foreign Application Priority Data
Dec. 20, 2005 (JP) ............................. 2005-367249

(51) Int. Cl.
| H01L 27/108 | (2006.01) |
| H01L 29/76 | (2006.01) |
| H01L 29/94 | (2006.01) |
| H01L 31/119 | (2006.01) |

(52) U.S. Cl. ...................... 257/328; 257/302; 257/341; 257/342

(58) Field of Classification Search ................. 257/302, 257/328, 341, 342, E21.034
See application file for complete search history.

(56) References Cited

U.S. PATENT DOCUMENTS

| 6,844,592 B2 | 1/2005 | Yamaguchi et al. |
| 6,888,195 B2 | 5/2005 | Saito et al. |
| 7,115,475 B2 | 10/2006 | Yamaguchi et al. |
| 2005/0280086 A1 | 12/2005 | Saito et al. |
| 2006/0033153 A1 | 2/2006 | Onishi et al. |

FOREIGN PATENT DOCUMENTS

JP 2003-115589 4/2003

OTHER PUBLICATIONS

U.S. Appl. No. 12/252,872, filed Oct. 16, 2008, Saito, et al.

*Primary Examiner*—William M. Brewster
(74) *Attorney, Agent, or Firm*—Oblon, Spivak, McClelland, Maier & Neustadt, L.L.P.

(57) ABSTRACT

A semiconductor device includes: a semiconductor layer of a first conductivity type; a first semiconductor pillar region of the first conductivity type and a second semiconductor pillar region of a second conductivity type provided on the major surface; a first semiconductor region of the second conductivity type provided on the second semiconductor pillar region; a first and second main electrodes; a control electrode; a third semiconductor region of the first conductivity type provided on the major surface of the semiconductor layer and located on a terminal side of the first semiconductor pillar region and the second semiconductor pillar region; a high resistance semiconductor layer provided on the third semiconductor region; and a fourth semiconductor region of the second conductivity type provided on the high resistance semiconductor layer. An amount of dopant in at least one of the first semiconductor pillar region and the second semiconductor pillar region is gradually varied in a direction from the first main electrode to the second main electrode. The amount of dopant in the first semiconductor pillar region is smaller than the amount of dopant in the second semiconductor pillar region on the first main electrode side. The amount of dopant in the first semiconductor pillar region is larger than the amount of dopant in the second semiconductor pillar region on the second main electrode side.

20 Claims, 23 Drawing Sheets

SEMICONDUCTOR DEVICE

CROSS-REFERENCE TO RELATED APPLICATION

This application is based upon and claims the benefit of priority from the prior Japanese Patent Application No.2005-367249, filed on Dec. 20, 2005; the entire contents of which are incorporated herein by reference.

BACKGROUND OF THE INVENTION

1. Field of the Invention

This invention relates to a semiconductor device, and more particularly to a semiconductor device having a superjunction structure.

2. Background Art

Vertical MOSFETs (Metal Oxide Semiconductor Field Effect Transistors) suitable for power electronics application are conventionally known. The on-resistance of this MOSFET greatly depends on the electric resistance of the conduction layer (drift layer). The resistance can be decreased by increasing the dopant concentration in the drift layer. However, there is a limitation on the increase of dopant concentration for ensuring a desired breakdown voltage. That is, there is a tradeoff between the device breakdown voltage and the on-resistance. Improving this tradeoff is important for low power consumption devices.

As an example MOSFET improving the tradeoff, a MOSFET having a structure called the "superjunction structure" is known, where p-type pillar regions and n-type pillar regions are provided in parallel in the drift layer. In this structure, a non-doped layer is artificially produced by equalizing the amount of dopant contained in the p-type pillar region and the n-type pillar region. While maintaining high breakdown voltage, a current is allowed to flow through the n-type pillar region doped with high concentration. Thus a device with low on-resistance over the limit of the material is realized.

Furthermore, in a semiconductor device having a superjunction structure, the breakdown voltage and avalanche withstand capability depend not only on the structure of the device section, but also on the structure of the terminal section For example, JP 2003-115589A discloses a semiconductor device having a superjunction structure in the terminal section as well as in the device section. However, this configuration has a large decrease of breakdown voltage in the terminal section versus the fluctuation of the amount of dopant.

Moreover, if the terminal section has no superjunction structure, electrons and holes generated upon avalanche breakdown cause the electric field in the top and bottom portion of the terminal section to increase. This increases the breakdown current, which is likely to destroy the device. That is, the device has a low avalanche withstand capability.

SUMMARY OF THE INVENTION

According to an aspect of the invention, there is provided a semiconductor device including: a semiconductor layer of a first conductivity type; a first semiconductor pillar region of the first conductivity type provided on a major surface of the semiconductor layer; a second semiconductor pillar region of a second conductivity type provided on the major surface of the semiconductor layer and being adjacent to the first semiconductor pillar region; a first semiconductor region of the second conductivity type provided on the second semiconductor pillar region; a second semiconductor region of the first conductivity type selectively provided on a surface of the first semiconductor region; a first main electrode provided on the first semiconductor region and the second semiconductor region; an insulating film provided on the first semiconductor pillar region, the first semiconductor region, and the second semiconductor region; a control electrode provided on the insulating film; a second main electrode provided on a side opposite to the major surface of the semiconductor layer; a third semiconductor region of the first conductivity type provided on the major surface of the semiconductor layer and located on a terminal side of the first semiconductor pillar region and the second semiconductor pillar region; a fourth semiconductor region of the second conductivity type provided on the major surface of the semiconductor layer and located on the terminal side of the first semiconductor pillar region and the second semiconductor pillar region, the fourth semiconductor region being adjacent to the third semiconductor region; a high resistance semiconductor layer provided on the third semiconductor region and the fourth semiconductor region; a fifth semiconductor region of the first conductivity type provided on the high resistance semiconductor layer; and a sixth semiconductor region of the second conductivity type provided on the high resistance semiconductor layer and being adjacent to the fifth semiconductor region, an amount of dopant in at least one of the first semiconductor pillar region and the second semiconductor pillar region being gradually varied in a direction from the first main electrode to the second main electrode, the amount of dopant in the first semiconductor pillar region being smaller than the amount of dopant in the second semiconductor pillar region on the first main electrode side, and the amount of dopant in the first semiconductor pillar region being larger than the amount of dopant in the second semiconductor pillar region on the second main electrode side.

According to other aspect of the invention, there is provided a semiconductor device including: a semiconductor layer of a first conductivity type; a first semiconductor pillar region of the first conductivity type provided on a major surface of the semiconductor layer; a second semiconductor pillar region of a second conductivity type provided on the major surface of the semiconductor layer and being adjacent to the first semiconductor pillar region; a first semiconductor region of the second conductivity type provided on the second semiconductor pillar region; a second semiconductor region of the first conductivity type selectively provided on a surface of the first semiconductor region; a first main electrode provided on the first semiconductor region and the second semiconductor region; an insulating film provided on the first semiconductor pillar region, the first semiconductor region, and the second semiconductor region; a control electrode provided on the insulating film; a second main electrode provided on a side opposite to the major surface of the semiconductor layer; a third semiconductor region of the first conductivity type provided on the major surface of the semiconductor layer and located on a terminal side of the first semiconductor pillar region and the second semiconductor pillar region; a high resistance semiconductor layer provided on the third semiconductor region; and a fourth semiconductor region of the second conductivity type provided on the high resistance semiconductor layer, an amount of dopant in at least one of the first semiconductor pillar region and the second semiconductor pillar region being gradually varied in a direction from the first main electrode to the second main electrode, the amount of dopant in the first semiconductor pillar region being smaller than the amount of dopant in the second semiconductor pillar region on the first main electrode side, and the amount of dopant in the first semiconductor pillar region being larger than the amount of dopant in the second semiconductor pillar region on the second main electrode side.

According to other aspect of the invention, there is provided a semiconductor device including: a semiconductor layer of a first conductivity type; a first semiconductor pillar region of the first conductivity type provided on a major surface of the semiconductor layer; a second semiconductor pillar region of a second conductivity type provided on the major surface of the semiconductor layer and being adjacent to the first semiconductor pillar region; a first semiconductor region of the second conductivity type provided on the second semiconductor pillar region; a second semiconductor region of the first conductivity type selectively provided on a surface of the first semiconductor region; a first main electrode provided on the first semiconductor region and the second semiconductor region; an insulating film provided on the first semiconductor pillar region, the first semiconductor region, and the second semiconductor region; a control electrode provided on the insulating film; and a second main electrode provided on a side opposite to the major surface of the semiconductor layer, in a top portion of the first semiconductor pillar region and the second semiconductor pillar region on the first main electrode side, an amount of dopant in the first semiconductor pillar region being smaller than an amount of dopant in the second semiconductor pillar region, in a bottom portion of the first semiconductor pillar region and the second semiconductor pillar region on the second main electrode side, the amount of dopant in the first semiconductor pillar region being larger than the amount of dopant in the second semiconductor pillar region, and in a portion between the top portion and the bottom portion of the first semiconductor pillar region and the second semiconductor pillar region, the amount of dopant in the first semiconductor pillar region being substantially equal to the amount of dopant in the second semiconductor pillar region.

DETAILED DESCRIPTION OF THE INVENTION

Figure 1:
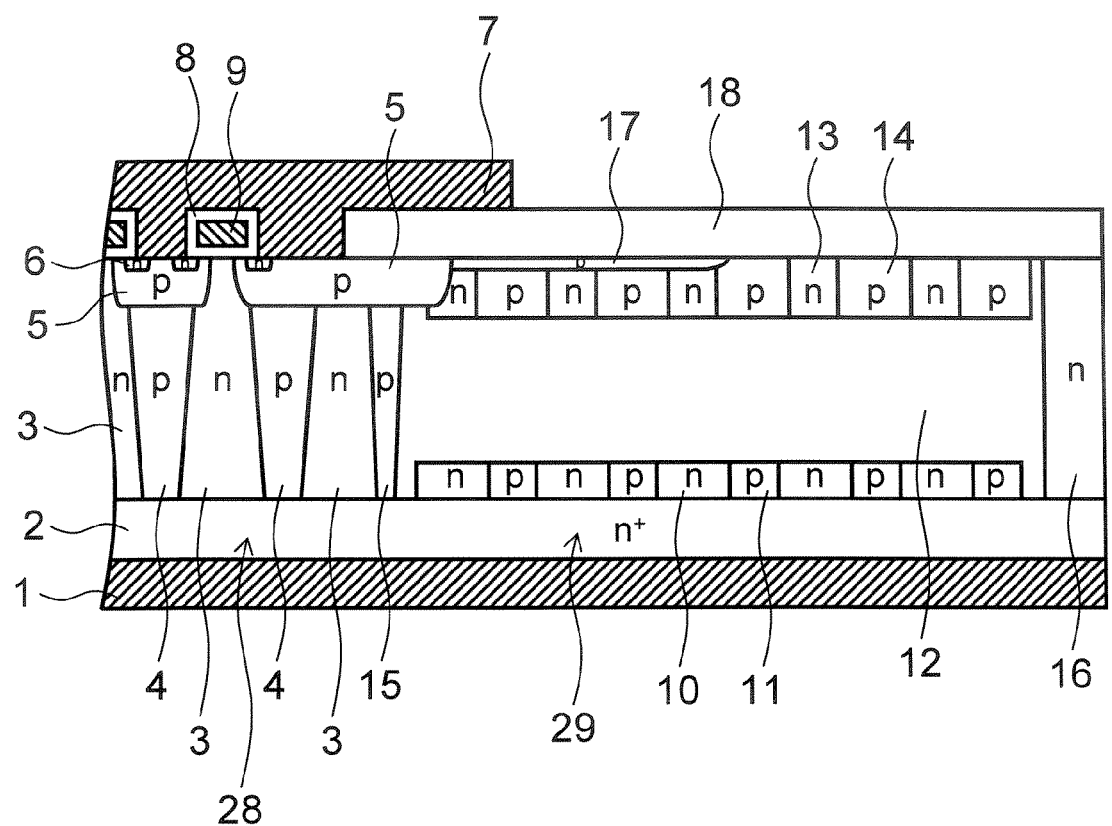
FIG. 1 is a schematic cross-sectional view illustrating the cross-sectional structure of the main part of a semiconductor device according to a first embodiment of the invention.

Embodiments of the invention will now be described with reference to the drawings. The following embodiments are described assuming the first conductivity type as n-type and the second conductivity type as p-type. Like elements in the drawings are marked with like reference numerals.

First Embodiment

FIG. 1 is a schematic cross-sectional view illustrating the cross-sectional structure of the main part of a semiconductor device according to a first embodiment of the invention.

Figure 2:
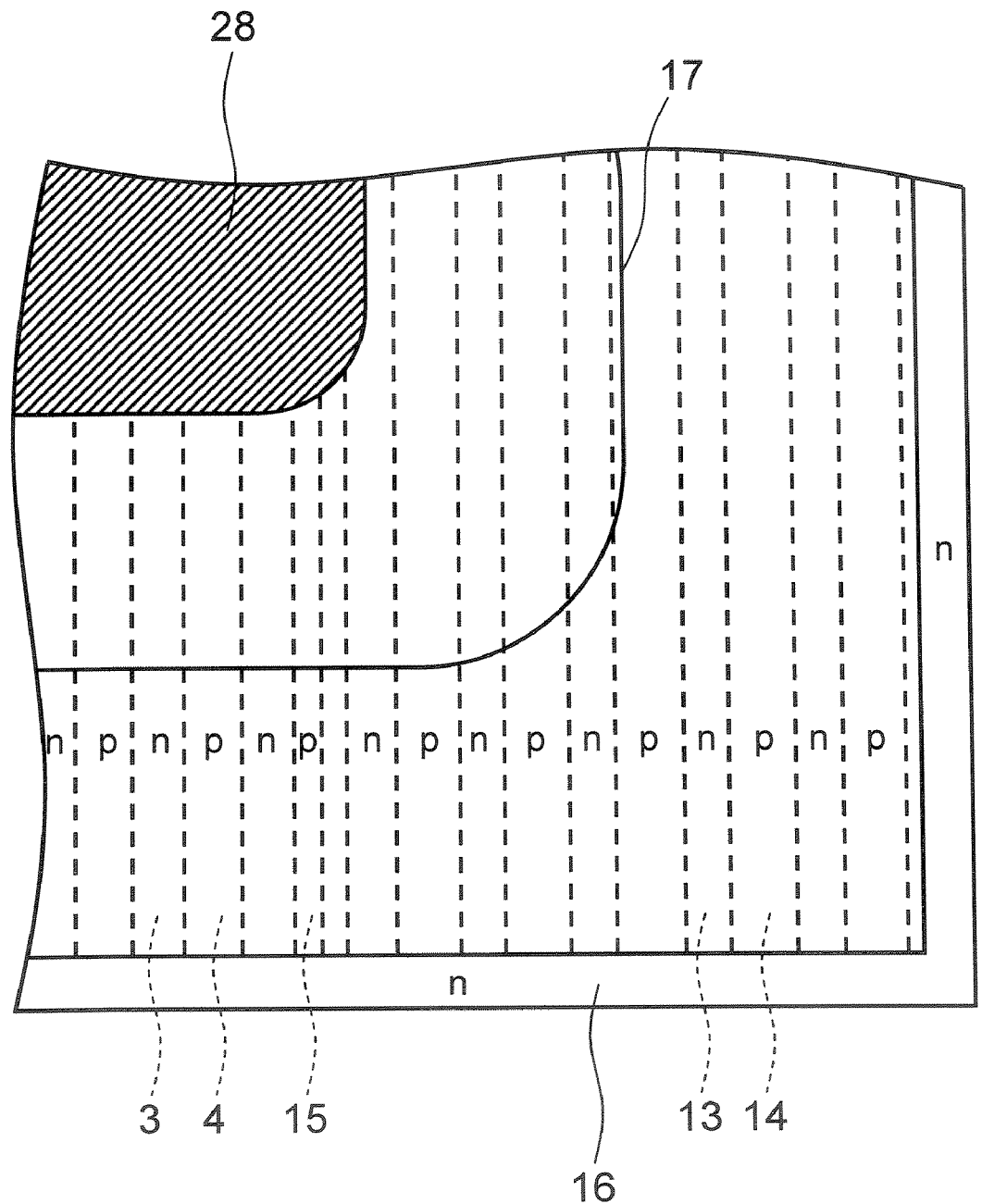
FIG. 2 is a schematic plan view illustrating the planar structure of the main part of the semiconductor device according to the first embodiment.

FIG. 2 is a schematic plan view illustrating the planar structure of the main part of the semiconductor device.

On a major surface of an $n^+$-type silicon semiconductor layer 2 having high dopant concentration, first pillar regions 3 of n-type silicon (hereinafter also simply referred to as "n-type pillar regions") and second pillar regions 4 of p-type silicon (hereinafter also simply referred to as "p-type pillar regions") are provided in parallel in a striped configuration.

The n-type pillar region 3 and the p-type pillar region 4 constitute a so-called superjunction structure. That is, the n-type pillar region 3 and the p-type pillar region 4 are adjacent to each other to form a pn-junction. An outermost p-type pillar region 15 is provided adjacent to an n-type pillar region 3 in the outermost portion of the superjunction structure.

On the p-type pillar region 4 is provided a base region (first semiconductor region) 5 of p-type silicon in contact with the p-type pillar region 4. Like the p-type pillar region 4, the base region 5 is also adjacent to the n-type pillar region 3 to form a pn-junction. A source region (second semiconductor region) 6 of n$^+$-type silicon is selectively provided on the surface of the base region 5.

A source electrode 7 serving as a first main electrode is provided on part of the source region 6 and on the portion between the base region 5 and the source region 6. The source region 6 is electrically connected to the source electrode 7.

An insulating film 8 is provided on the portion extending from the n-type pillar region 3 via the base region 5 to the source region 6. The insulating film 8 is a silicon oxide film, for example, and has a film thickness of about 0.1 micrometer. Note that the insulating film 8 collectively refers to a gate insulating film formed on the channel (the surface of the base region 5 between the n-type pillar region 3 and the source region 6) and an interlayer insulating film between the gate electrode and the source electrode.

A control electrode (gate electrode) 9 is provided on the insulating film (gate insulating film) 8. A drain electrode 1 serving as a second main electrode is provided on the side opposite to the major surface of the semiconductor layer 2.

The foregoing components are main elements of a device section 28 in the semiconductor device. When a prescribed control voltage is applied to the control electrode 9, a channel is formed in the vicinity of the surface of the base region 5 immediately below the control electrode 9 and allows conduction between the source region 6 and the n-type pillar region 3. As a result, a main current path is formed between the source electrode 7 and the drain electrode 1 via the source region 6, the n-type pillar region 3, and the semiconductor layer 2. Thus the path between the electrodes 7 and 1 is turned into the ON state.

In this embodiment, the amounts of dopant in the n-type pillar region 3 and in the p-type pillar region 4 are each gradually varied in the direction (thickness direction) from the source electrode 7 to the drain electrode 1. The amount of dopant in the p-type pillar region 4 is gradually deceased in the direction from the source electrode 7 to the drain electrode 1, and the amount of dopant in the n-type pillar region 3 is gradually increased in the direction from the source electrode 7 to the drain electrode 1.

That is, in the top portion of the superjunction structure on the source electrode 7 side, the amount of dopant in the n-type pillar region 3 is smaller than the amount of dopant in the p-type pillar region 4, whereas in the bottom portion on the drain electrode 1 side, the amount of dopant in the n-type pillar region 3 is larger than the amount of dopant in the p-type pillar region 4. This makes it possible to prevent the increase of electric field in the top and bottom portion of the superjunction structure, thereby enhancing avalanche withstand capability. The variation of the amount of dopant in the thickness direction of the pillar region is preferably such that the amount of dopant in the top portion of the p-type pillar region 4 is about 1.1 to 2.3 times the amount of dopant in the bottom portion, for example.

The electric field distribution in the superjunction structure is determined by the difference between the amount of dopant in the n-type pillar region 3 and the amount of dopant in the p-type pillar region 4. Therefore the amount of dopant may be varied in the thickness direction both in the n-type pillar region 3 and in the p-type pillar region 4, or only the amount of dopant in one type of the pillar regions may be varied in the thickness direction while the amount of dopant in the other type of the pillar regions is left uniform in the thickness direction.

The term "amount of dopant" used herein refers to the amount of dopant contained in the pillar region and equals the product of the dopant concentration [cm$^{-3}$] and the cross-sectional area of the pillar region [cm$^2$]. Therefore the amount of dopant in the pillar region can be varied in the thickness direction by varying at least one of the dopant concentration and the cross-sectional area of the pillar region in the thickness direction.

A terminal section 29 is formed outside the device section 28 described above. On the major surface of the semiconductor layer 2 in the terminal section 29, terminal bottom n-type regions (third semiconductor regions) 10 of n-type silicon and terminal bottom p-type regions (fourth semiconductor regions) 11 of p-type silicon are provided in parallel in a striped configuration The terminal bottom n-type region 10 and the terminal bottom p-type region 11 are adjacent to each other to form a pn-junction. The amount of dopant in the terminal bottom n-type region 10 is larger than the amount of dopant in the terminal bottom p-type region 11.

On the terminal bottom n-type regions 10 and the terminal bottom p-type regions 11 is provided a high resistance semiconductor layer 12 having a higher resistance than these regions. On the high resistance semiconductor layer 12, terminal top n-type regions (fifth semiconductor regions) 13 of n-type silicon and terminal top p-type regions (sixth semiconductor regions) 14 of p-type silicon are provided in parallel in a striped configuration.

The terminal top n-type region 13 and the terminal top p-type region 14 are adjacent to each other to form a pn-junction. The amount of dopant in the terminal top n-type region 13 is smaller than the amount of dopant in the terminal top p-type region 14.

Across the high resistance semiconductor layer 12, the terminal top n-type regions 13 overlie the terminal bottom n-type regions 10, and the terminal top p-type regions 14 overlie the terminal bottom p-type regions 11. The innermost terminal top n-type region 13 is in contact with the outermost base region 5.

The high resistance semiconductor layer 12 has a higher resistance than the n-type pillar region 3, the p-type pillar region 4, 15, the terminal bottom n-type region 10, the terminal bottom p-type region 11, the terminal top n-type region 13, and the terminal top p-type region 14.

On part of the surface of the terminal top n-type regions 13 and the terminal top p-type regions 14 is formed a RESURF (reduced surface field) region 17 of p-type silicon that laterally spreads a depletion layer to achieve high breakdown voltage upon application of high voltage. The RESURF region 17 is in contact with the outermost base region 5.

A field stop layer 16 of n-type silicon is formed in the outermost portion of the terminal section 29 and prevents the depletion layer from reaching the dicing line of the chip. Thus the decrease of reliability such as generation of leak current and variation of breakdown voltage can be prevented. Therefore the high resistance semiconductor layer 12 may be implemented in both p-type and n-type. The field stop layer 16 can be formed simultaneously with the n-type pillar region 3. Furthermore, an insulating film 18 is provided on the terminal section 29. A field stop electrode may be formed on the surface of the field stop layer 16.

Here, comparative examples investigated by the inventor in the process of reaching the invention are described.

Figure 3:
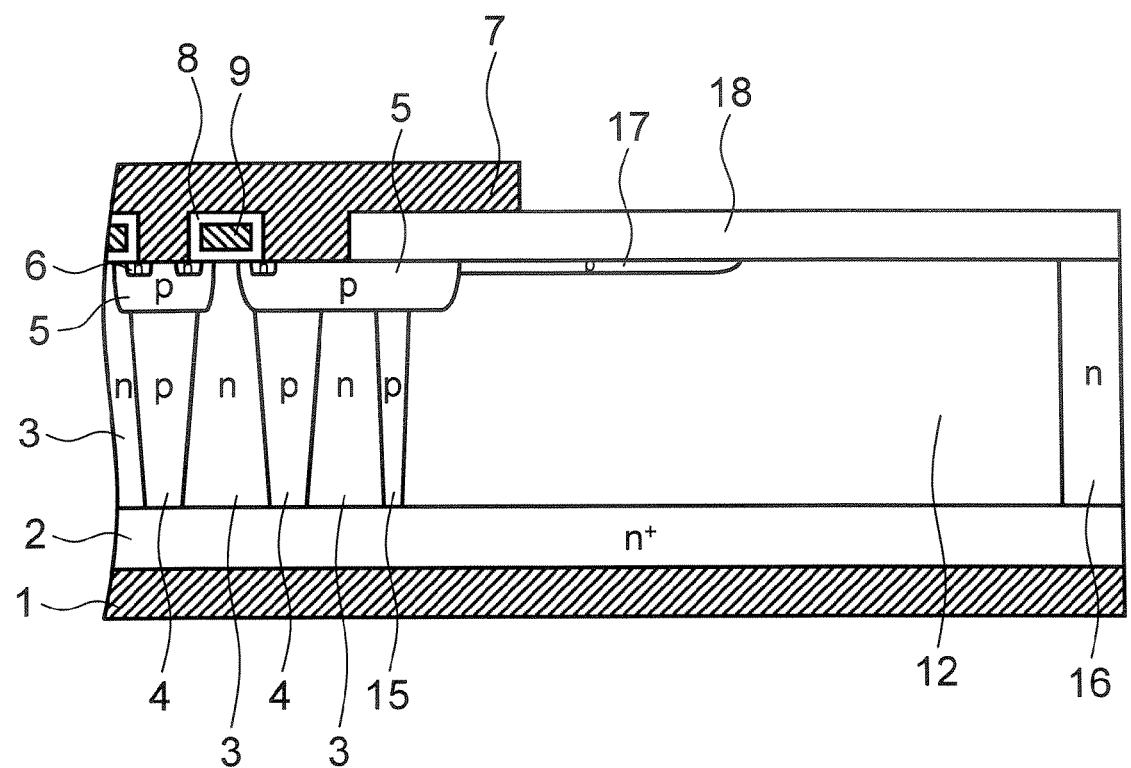
FIG. 3 is a schematic cross-sectional view illustrating the cross-sectional structure of the main part of a semiconductor device according to a first comparative example.

FIG. 3 is a schematic cross-sectional view illustrating the cross-sectional structure of the main part of a semiconductor device of a first comparative example.

Figure 4:
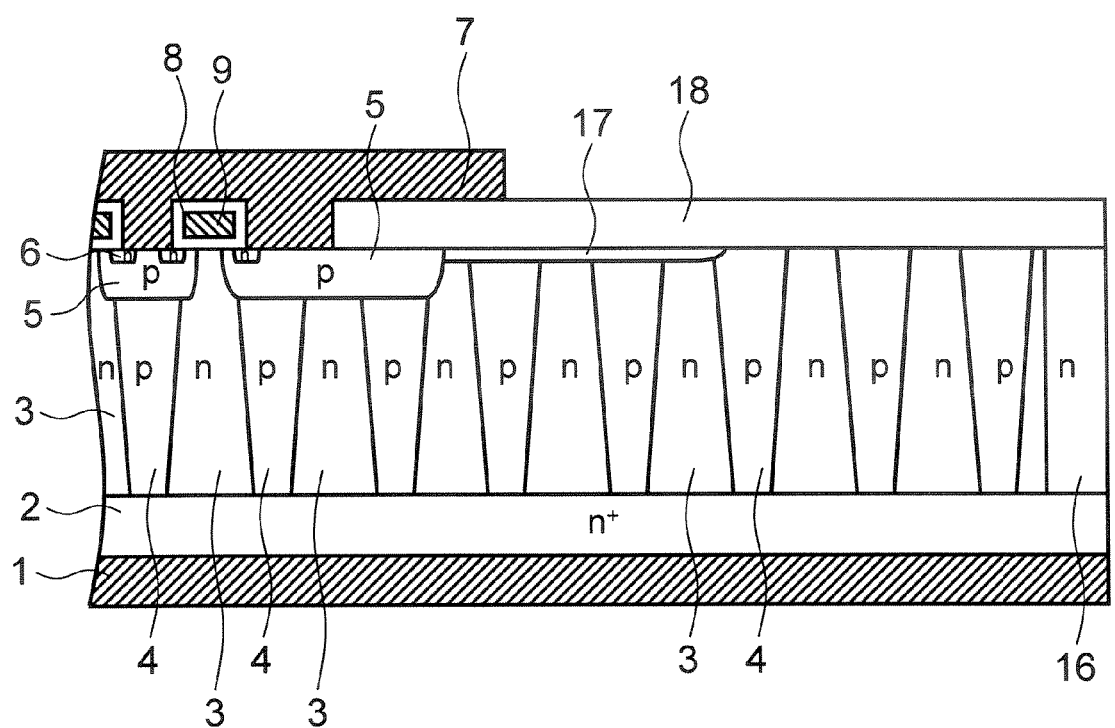
FIG. 4 is a schematic cross-sectional view illustrating the cross-sectional structure of the main part of a semiconductor device according to a second comparative example.

FIG. 4 is a schematic cross-sectional view illustrating the cross-sectional structure of the main part of a semiconductor device of a second comparative example. In the first comparative example shown in FIG. 3, the terminal section has no superjunction structure.

In the second comparative example shown in FIG. 4, the terminal section has a superjunction structure similar to that in the device section. That is, a superjunction structure is also provided between the top and bottom portion.

Any fluctuation (unevenness) of the amount of dopant in the n-type pillar region and the p-type pillar region constituting the superjunction structure decreases the breakdown voltage. The decrease of breakdown voltage greatly depends on the structure of the terminal section as well as that of the device section.

Figure 5:
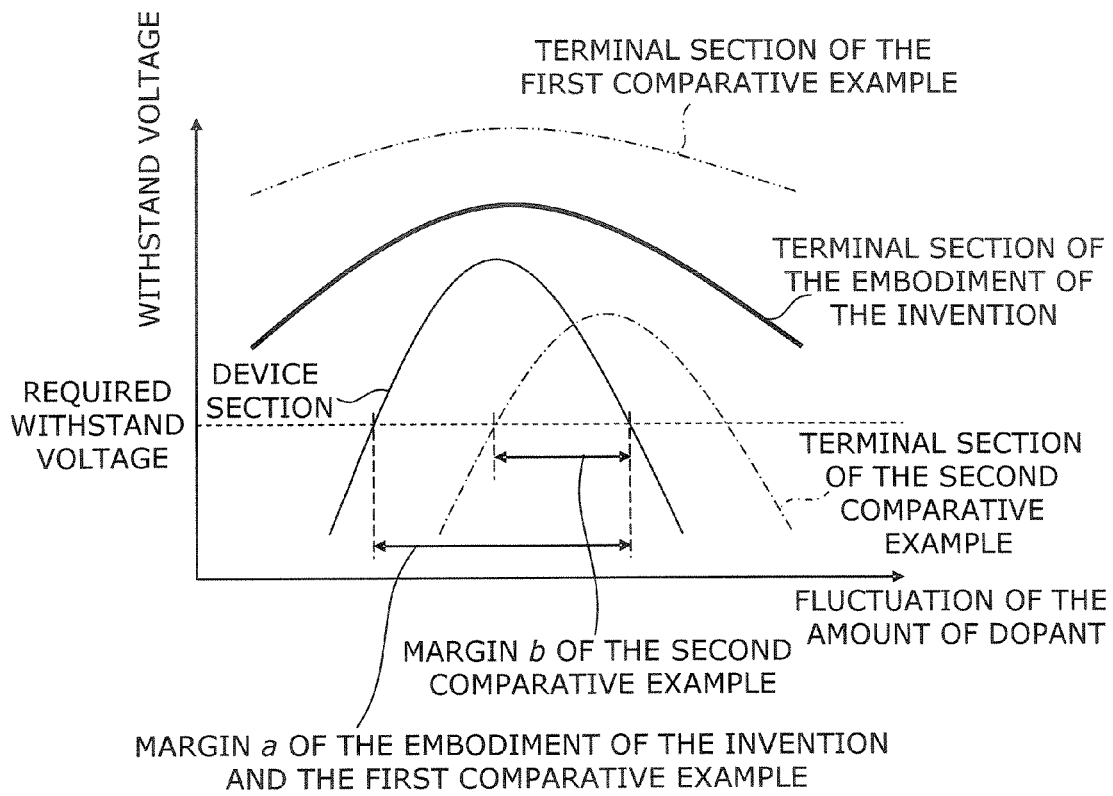
FIG. 5 is a graph showing the decrease of breakdown voltage versus the fluctuation of the amount of dopant.

FIG. 5 is a graph showing the breakdown voltage variation (vertical axis) versus the fluctuation of the amount of dopant in the n-type pillar region and the p-type pillar region (horizontal axis).

The thin solid line indicates the breakdown voltage variation of the device section common to the embodiment of the invention (FIG. 1), the first comparative example (FIG. 3), and the second comparative example (FIG. 4).

In the first comparative example having no superjunction structure in the terminal section, the breakdown voltage of the terminal section varies little irrespective of the fluctuation of the amount of dopant in the device section as indicated by a double-dot dashed line. The device breakdown voltage is determined by the lower of the breakdown voltages of the device section and the terminal section. In the first comparative example, the fluctuation margin of the amount of dopant for obtaining the required breakdown voltage is the fluctuation margin a of the amount of dopant in the device section.

In the second comparative example where the terminal section also has a superjunction structure similar to that in the device section, the decrease of breakdown voltage of the terminal section versus the fluctuation of the amount of dopant is large as indicated by a dot dashed line. Furthermore, the plot of the breakdown voltage variation of the terminal section is shifted relative to the plot of the breakdown voltage variation of the device section. Because the device breakdown voltage is determined by the lower of the breakdown voltages of the device section and the terminal section, the fluctuation margin b of the amount of dopant for obtaining the required breakdown voltage is narrower in the second comparative example than in the first comparative example.

In the present embodiment shown in FIG. 1, the terminal section 29 has a superjunction structure only in the bottom and top portion thereof, and a high resistance semiconductor layer 12 is provided between the bottom and top portion. Therefore the breakdown voltage of the terminal section 29 is resistant to decreasing under the fluctuation of the amount of dopant in the n-type region and the p-type region Thus, as indicated by a thick solid line, a breakdown voltage higher than that of the device section 28 can be obtained. Therefore, like the first comparative example, this embodiment can ensure a relatively wide fluctuation margin of the amount of dopant for obtaining the required breakdown voltage. This can eliminate the requirement for high processing accuracy and facilitate cost reduction.

On the other hand, power MOSFETs also require high avalanche withstand capability. The avalanche withstand capability is determined by the magnitude of the current due to avalanche breakdown that can flow without destroying the device. The avalanche withstand capability also depends on the structure of the terminal section as well as that of the device section.

Figure 6:
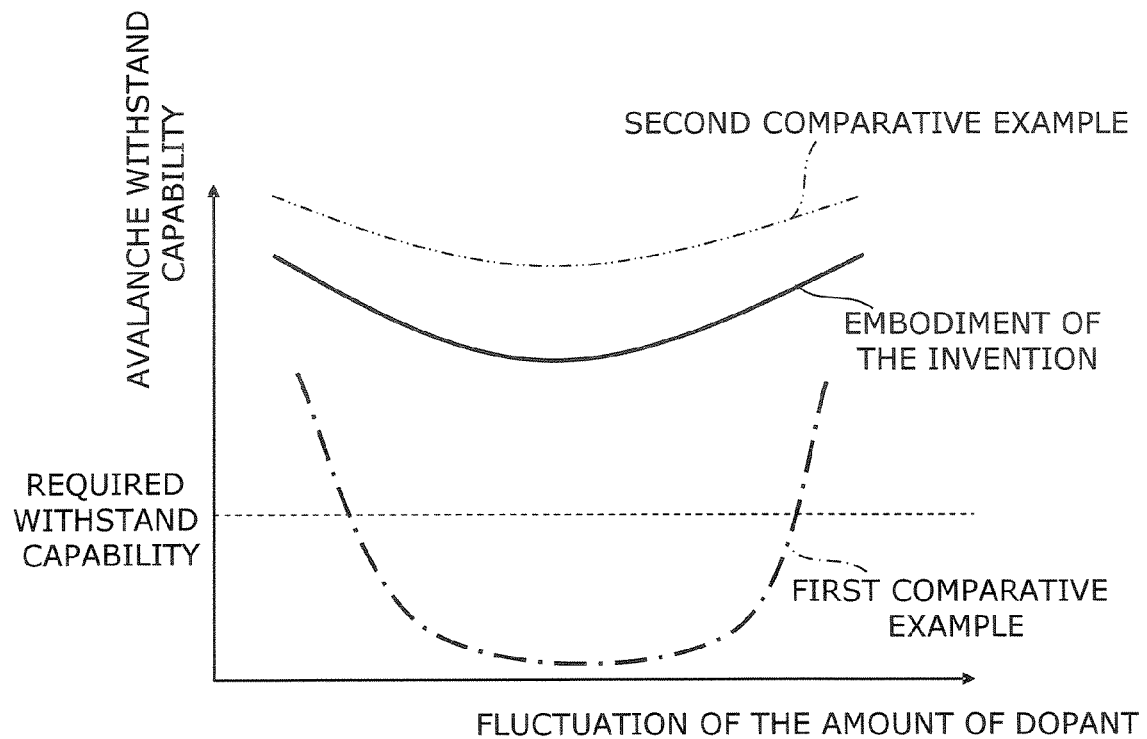
FIG. 6 is a graph showing the variation of avalanche withstand capability versus the fluctuation of the amount of dopant.

FIG. 6 is a graph showing the variation of avalanche withstand capability (vertical axis) versus the fluctuation of the amount of dopant in the n-type pillar region and the p-type pillar region (horizontal axis).

The variation of avalanche withstand capability in the first comparative example, the second comparative example, and the embodiment of the invention is indicated by a dot dashed line, double-dot dashed line, and solid line, respectively.

In the second comparative example, the terminal section also has a superjunction structure, which decreases the electric field in the top and bottom portion. Therefore an avalanche withstand capability higher than the required withstand capability can be obtained.

In the first comparative example, the terminal section has no superjunction structure. Thus electrons and holes generated by avalanche breakdown enhance the electric field in the top and bottom portion and increase the breakdown current, which is likely to destroy the device. That is, the device has a low avalanche withstand capability.

In the embodiment of the invention, the bottom portion of the terminal section 29 has a superjunction structure composed of the n-type pillar regions 10 and the p-type pillar regions 11, and the top portion of the terminal section 29 has a superjunction structure composed of the n-type pillar regions 13 and the p-type pillar regions 14. Thus the increase of electric field in the top and bottom portion of the terminal section can be prevented, and the avalanche withstand capability can be enhanced.

To further enhance the effect of preventing the increase of electric field in the top and bottom portion of the terminal section, it is preferable that, like the superjunction structure of the device section 28, the amount of dopant in the n-type pillar region 10 be larger than the amount of dopant in the p-type pillar region 11 in the superjunction structure of the terminal bottom section, and that the amount of dopant in the p-type pillar region 14 be larger than the amount of dopant in the n-type pillar region 13 in the superjunction structure of the terminal top section.

As described above, according to this embodiment, it is possible to prevent the decrease of breakdown voltage due to the fluctuation of the amount of dopant in the superjunction structure of the terminal section, and to alleviate the electric field strength in the top and bottom portion thereof as well as in the device section, thereby enhancing avalanche withstand capability.

Furthermore, the n-type pillar region 13 and the p-type pillar region 14 provided in the terminal top section can be made deeper than the base region 5 to decrease the electric field at the bottom corner of the base region 5, thereby achieving higher breakdown voltage and higher avalanche withstand capability.

The configuration of this embodiment can be obtained by a process of repeating a plurality of iterations of ion implantation and buried epitaxial growth, for example.

Figure 7:
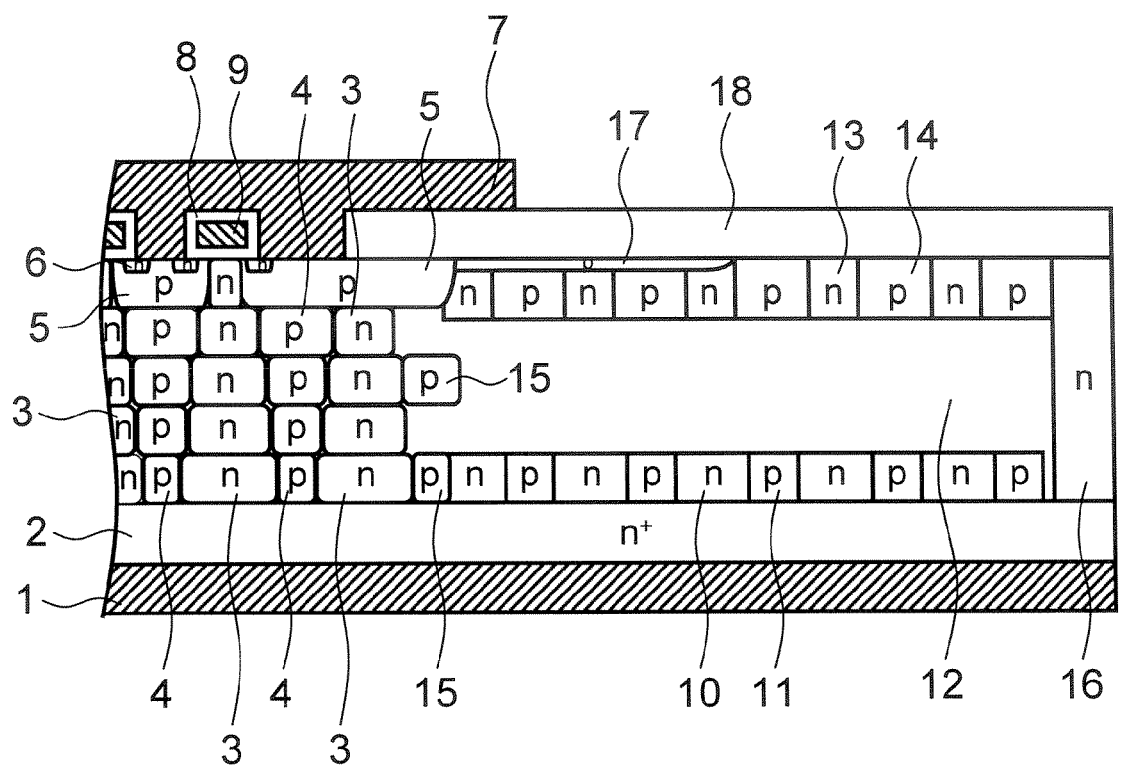
FIG. 7 is a schematic cross-sectional view illustrating a method for manufacturing a semiconductor device according to the first embodiment of the invention.

FIG. 7 schematically shows the process.

More specifically, in each iteration of the process, dopant ions for forming the n-type pillar region 3 and the p-type pillar region 4 are selectively implanted into the surface of the high resistance semiconductor layer, and buried epitaxial growth is conducted in the high resistance semiconductor layer This process is repeated for a plurality of iterations while varying the dose amount of ion implantation.

The terminal bottom n-type region 10, the terminal bottom p-type region 11, the terminal top n-type region 13, and the terminal top p-type region 14 can be formed simultaneously with the n-type pillar region 3 and the p-type pillar region 4 of the device section.

The outermost p-type pillar region 15, which is the outermost portion of the superjunction structure of the device section, is in contact with the n-type pillar region 3 only on one side. Therefore, to completely deplete the superjunction structure, the amount of dopant in the outermost p-type pillar region 15 needs to be half the amount of dopant in the inner p-type pillar region 4, which is in contact with the n-type pillar regions 3 on both sides To this end, in the portion where the outermost p-type pillar region 15 is to be provided, p-type regions are formed once every two iterations of the burying process. Then the amount of dopant in the outermost p-type pillar region 15 can be made half the amount of dopant in the p-type pillar region 4. The outermost portion of the superjunction structure of the device section is not limited to terminating with the p-type pillar region, but may be terminated with the n-type pillar region.

Other methods for manufacturing the superjunction structure of the device section include a method of forming a trench in an n-type semiconductor layer followed by buried growth of a p-type semiconductor layer in the trench, and a method of forming a trench followed by ion implantation into the trench sidewall. When the superjunction structure is formed by forming a trench and then burying the trench by crystal growth, the amount of dopant can be varied in the thickness direction by forming the trench in a tapered configuration rather than in a straight configuration.

Second Embodiment

Figure 8:
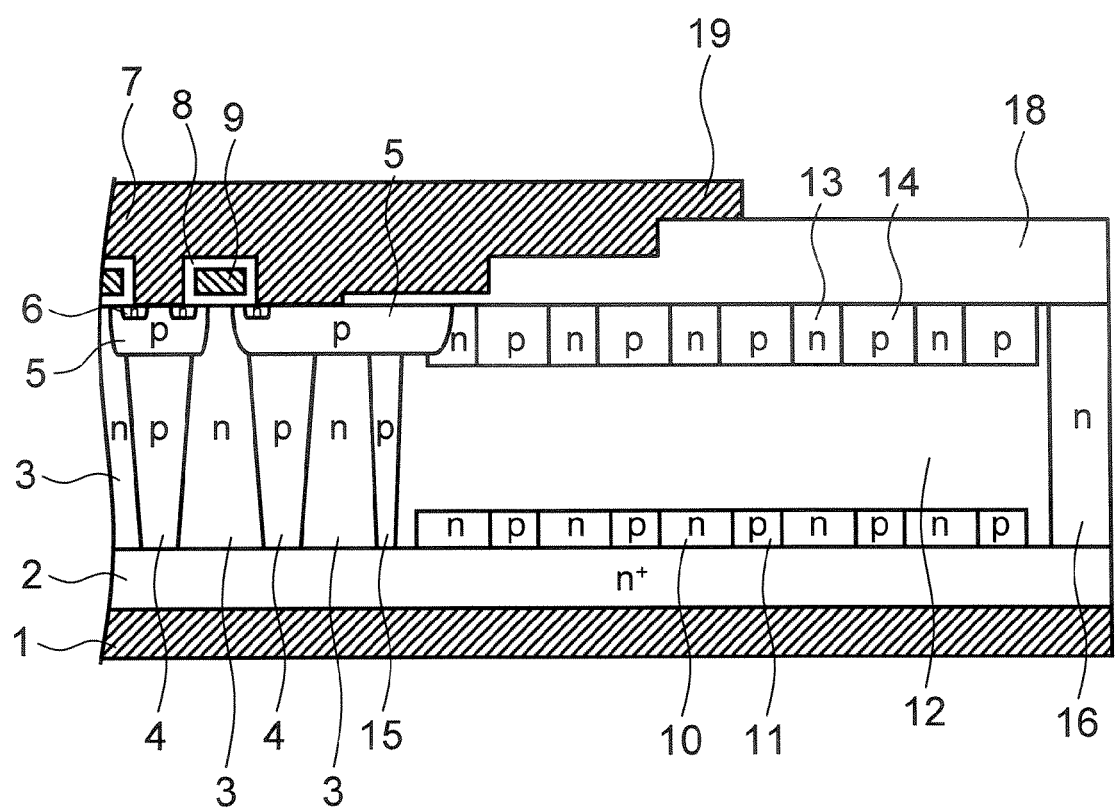
FIG. 8 is a schematic cross-sectional view illustrating the cross-sectional structure of the main part of a semiconductor device according to a second embodiment of the invention.

FIG. 8 is a schematic cross-sectional view illustrating the cross-sectional structure of the main part of a semiconductor device according to a second embodiment of the invention.

In this semiconductor device, like the first embodiment, the superjunction structure is provided only in the top and bottom portion of the terminal section, on which a field plate electrode 19 connected to the source electrode 7 is provided via an insulating film 18. Thus, even without the RESURF region 17 (see FIG. 1) as in the first embodiment, the depletion layer can be rapidly spread in the lateral direction of the terminal section, and a high breakdown voltage is achieved Note that the field plate electrode 19 may be connected to the control electrode 9.

Third Embodiment

Figure 9:
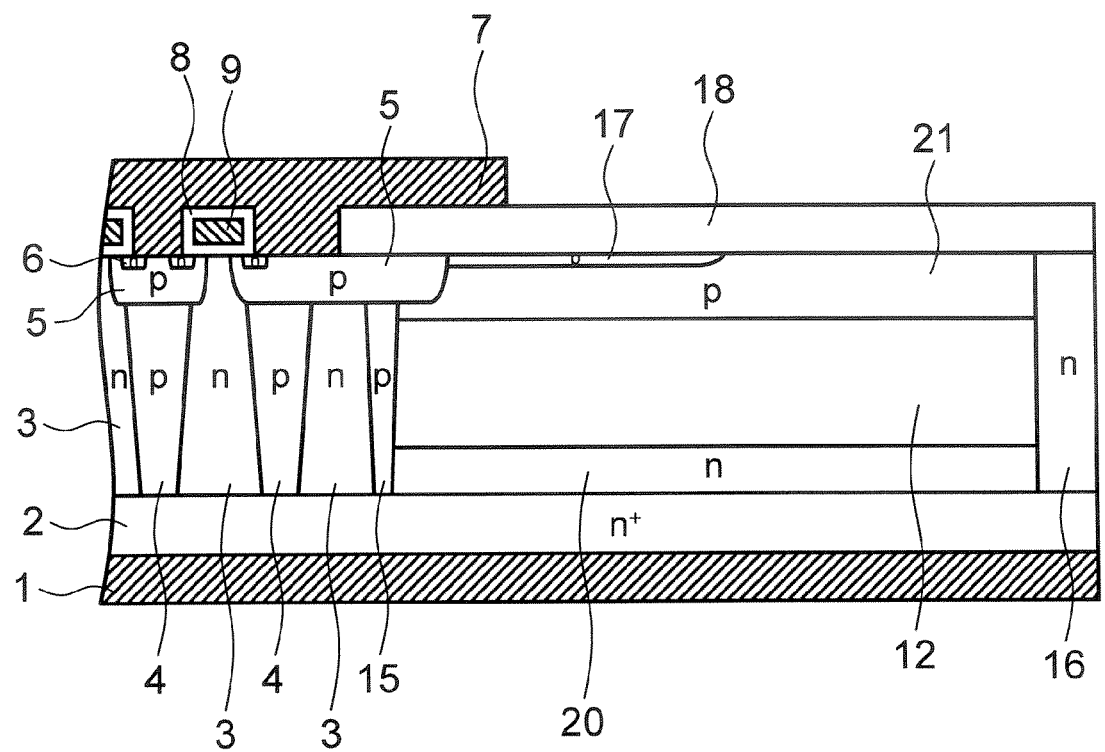
FIG. 9 is a schematic cross-sectional view illustrating the cross-sectional structure of the main part of a semiconductor device according to a third embodiment of the invention.

FIG. 9 is a schematic cross-sectional view illustrating the cross-sectional structure of the main part of a semiconductor device according to a third embodiment of the invention.

A terminal bottom n-type region (third semiconductor region) 20 of n-type silicon is provided on the major surface of the semiconductor layer 2 in the terminal section. On the terminal bottom n-type region 20 is provided a high resistance semiconductor layer 12, on which is provided a terminal top p-type region (fourth semiconductor region) 21 of p-type silicon. In this embodiment, unlike the first embodiment, the top and bottom portion of the terminal section does not form a superjunction structure. The high resistance semiconductor layer 12 has a higher resistance than the terminal bottom n-type region 20 and the terminal top p-type region 21.

According to this embodiment, the terminal bottom n-type region 20 provided in the bottom portion of the terminal section and the terminal top p-type region 21 provided in the top portion of the terminal section can prevent the increase of electric field in the bottom and top portion of the terminal section, and the avalanche withstand capability can be enhanced.

Furthermore, in this embodiment, because the terminal section has no superjunction structure, the decrease of breakdown voltage due to charge imbalance can be prevented.

Moreover, the terminal top p-type region 21 can be made deeper than the base region 5 to decrease the electric field at the bottom corner of the base region 5, thereby achieving higher breakdown voltage and higher avalanche withstand capability.

The configuration of this embodiment can be obtained by a process of repeating a plurality of iterations of ion implantation and buried epitaxial growth, for example.

Figure 10:
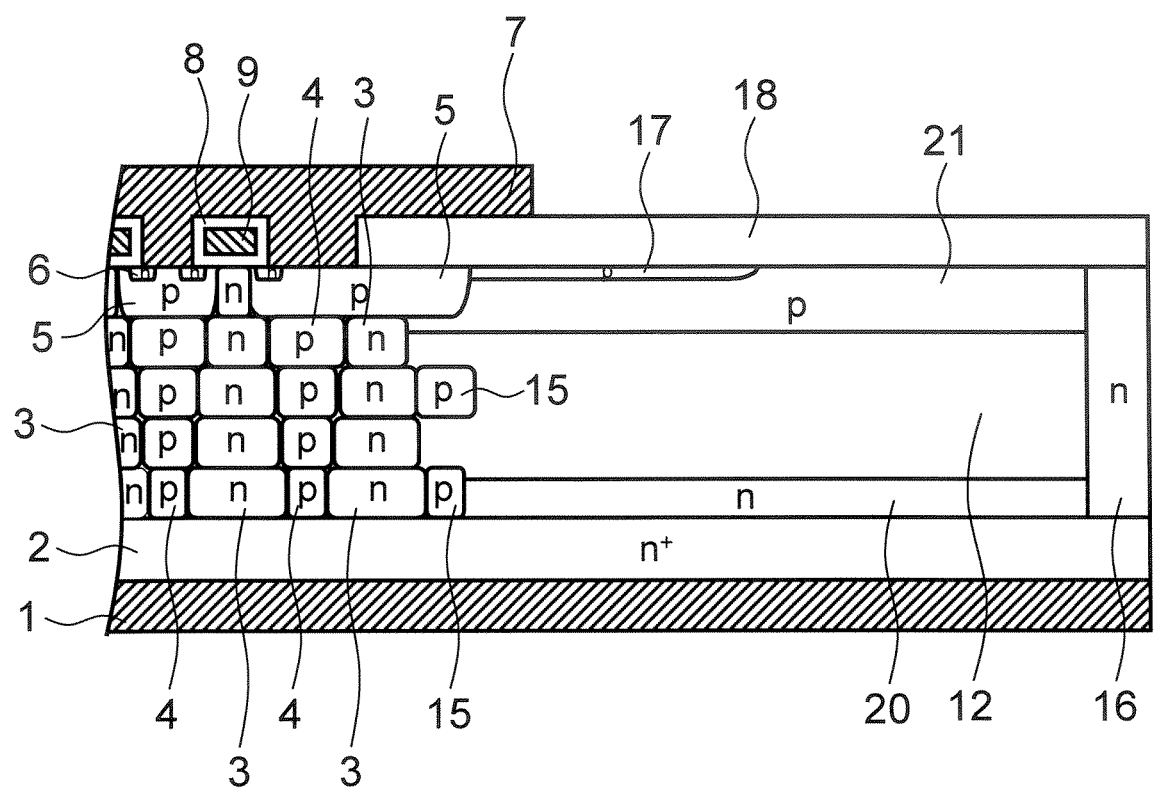
FIG. 10 is a schematic cross-sectional view illustrating a method for manufacturing a semiconductor device according to the third embodiment of the invention.

FIG. 10 schematically shows the process.

In the process of forming a superjunction structure of the device section by repeating ion implantation and buried growth, the terminal bottom n-type region 20 can be formed simultaneously with the lowermost portion of the superjunction structure, and the terminal top p-type region 21 can be formed simultaneously with the uppermost portion of the superjunction structure.

Like the first embodiment, to completely deplete the superjunction structure of the device section, the amount of dopant in the outermost p-type pillar region 15 needs to be half the amount of dopant in the inner p-type pillar region 4. To this end, in the portion where the outermost p-type pillar region 15 is to be provided, p-type regions are formed once every two iterations of the burying process. Then the amount of dopant in the outermost p-type pillar region 15 can be made half the amount of dopant in the p-type pillar region 4.

Fourth Embodiment

Figure 11:
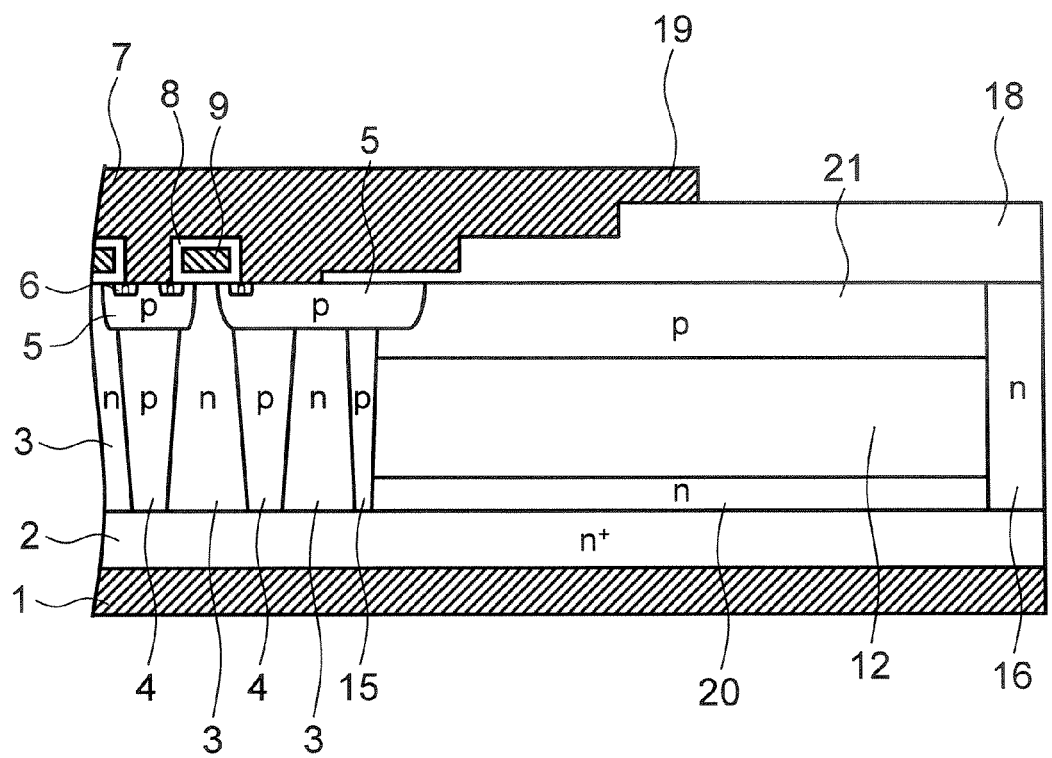
FIG. 11 is a schematic cross-sectional view illustrating the cross-sectional structure of the main part of a semiconductor device according to a fourth embodiment of the invention.

FIG. 11 is a schematic cross-sectional view illustrating the cross-sectional structure of the main part of a semiconductor device according to a fourth embodiment of the invention.

In this semiconductor device, the terminal section has an n-type region 20 at its bottom and a p-type region 21 at its top like the third embodiment. On the terminal section, a field plate electrode 19 connected to the source electrode 7 is provided via an insulating film 18. Thus, even without the RESURF region 17 (see FIG. 9) as in the third embodiment, the depletion layer can be rapidly spread in the lateral direction of the terminal section, and a high breakdown voltage is achieved. Note that the field plate electrode 19 may be connected to the control electrode 9.

Fifth Embodiment

Figures 12A, 12B:
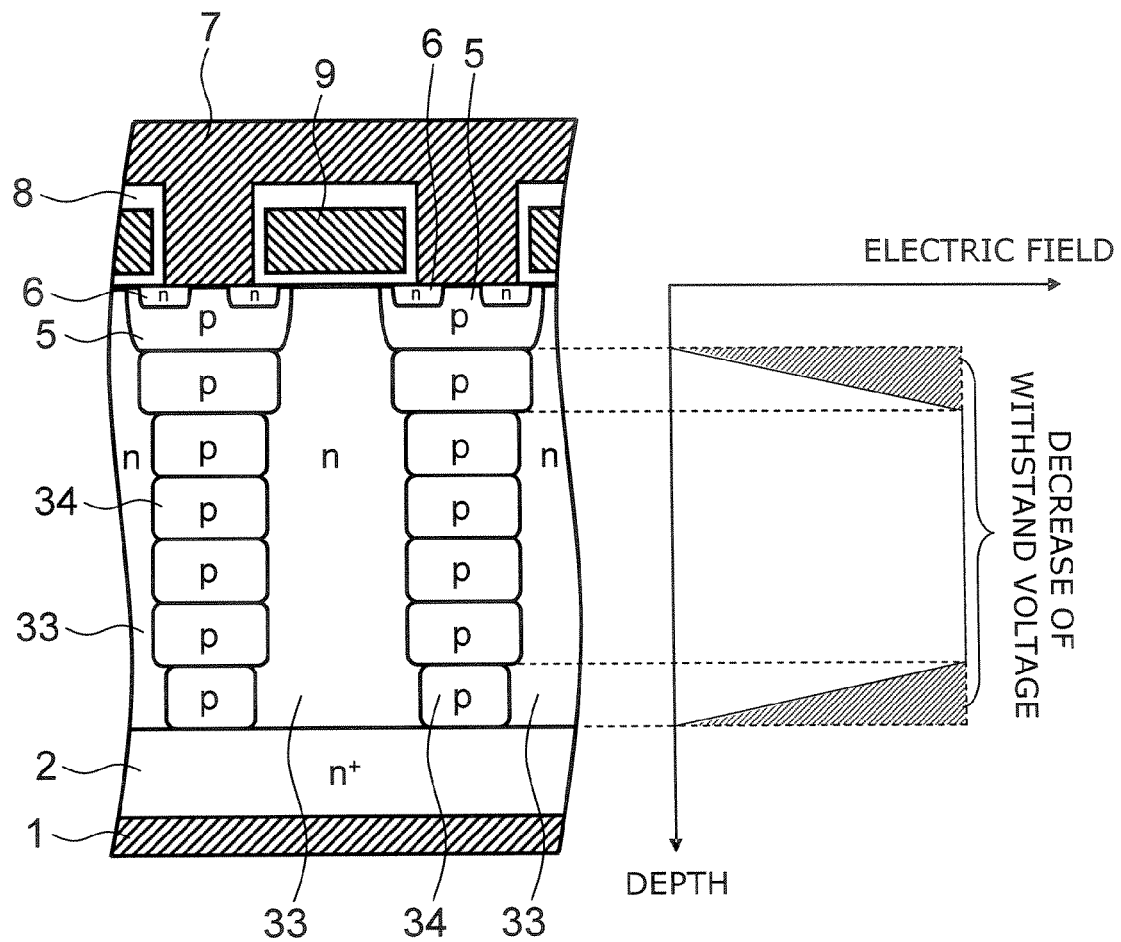
FIG. 12 schematically illustrates the cross-sectional structure of the main part of a semiconductor device and the variation of electric field in the depth direction of the pillar region according to a fifth embodiment of the invention.

FIG. 12A shows the cross-sectional structure of the main part of a semiconductor device according to a fifth embodiment of the invention, and FIG. 12B is a schematic diagram showing the variation of electric field in the depth (thickness) direction of the pillar region in the semiconductor device.

In the superjunction structure of the device section of this embodiment, the amount of dopant in the n-type pillar region 33 is uniform in the depth direction, whereas the amount of dopant in the p-type pillar region 34 is varied in three levels in the depth direction. The p-type pillar region 34 is the largest immediately below the base region 5, and the smallest in the bottom portion. In the intermediate portion therebetween, the amount of dopant is smaller than immediately below the base region 5, larger than in the bottom portion, and uniform in the depth direction.

More specifically, in this embodiment, the amount of dopant in the p-type pillar region 34 is larger than the amount of dopant in the n-type pillar region 33 in the top portion of the superjunction structure of the device section on the source electrode 7 side, and the amount of dopant in the n-type pillar region 33 is larger than the amount of dopant in the p-type pillar region 34 in the bottom portion on the drain electrode 1 side. In the portion between the top and the bottom portion, the amount of dopant in the n-type pillar region 33 is generally equal to the amount of dopant in the p-type pillar region 34.

The electric field distribution in the superjunction structure is determined by the difference between the amount of dopant in the n-type pillar region 33 and the amount of dopant in the p-type pillar region 34. Therefore the amount of dopant may be varied between the top and the bottom portion of both the n-type pillar region 33 and the p-type pillar region 34, or only the amount of dopant in one type of the pillar regions may be varied between the top and the bottom portion while the amount of dopant in the other type of the pillar regions is left uniform in the thickness direction. The "amount of dopant" used herein refers to the amount of dopant contained in the pillar region and equals the product of the dopant concentration [$cm^{-3}$] and the cross-sectional area of the pillar region [$cm^2$]. Therefore the amount of dopant in the pillar region can be varied by varying at least one of the dopant concentration and the cross-sectional area of the pillar region.

Figures 13A, 13B:
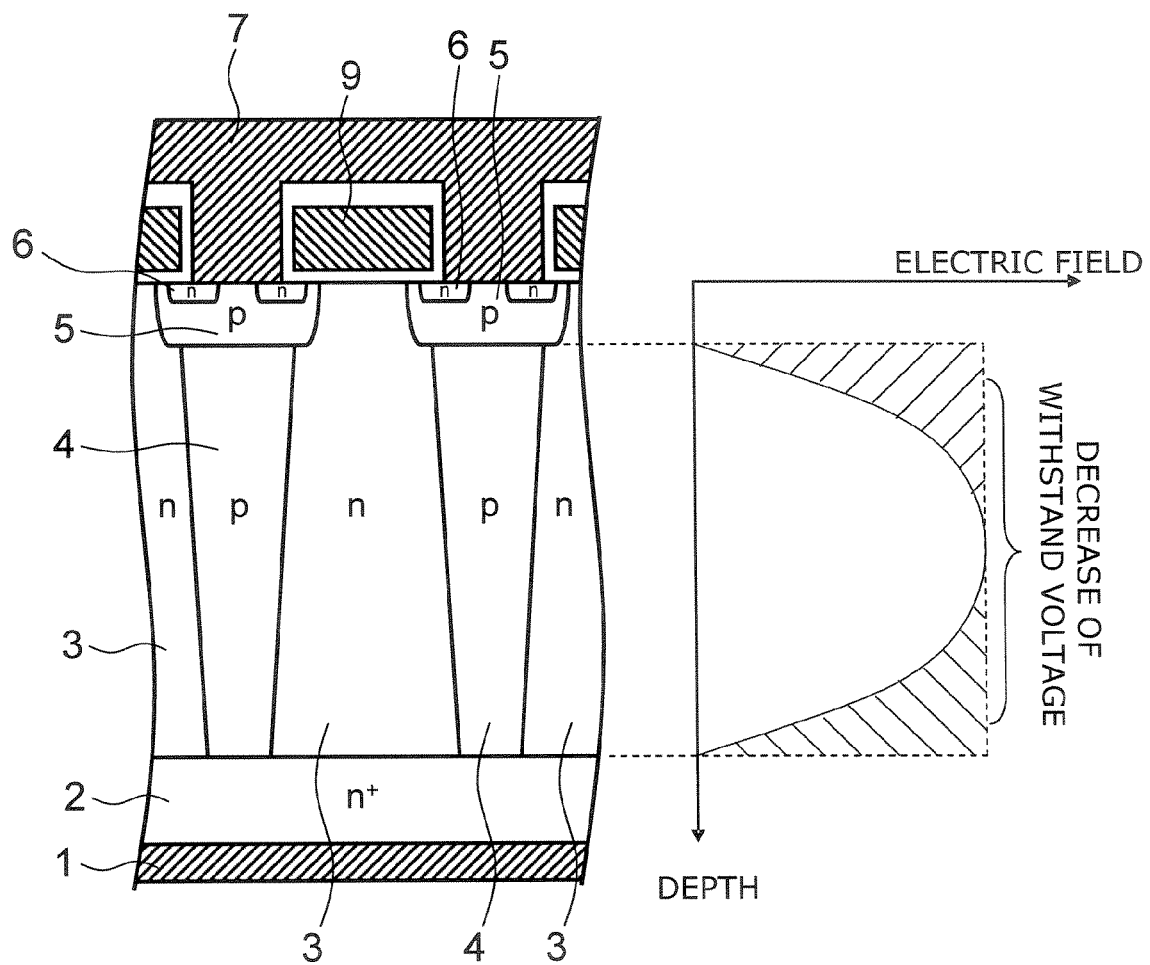
FIG. 13 schematically illustrates the cross-sectional structure of the main part of a semiconductor device and the variation of electric field in the depth direction of the pillar region where the amount of dopant in the pillar region is continuously varied in the depth direction.

FIG. 13A is a cross-sectional view of the main part of a semiconductor device having a similar structure to that of the first embodiment where the amount of dopant in the pillar region of the device section is continuously varied in the depth direction, and FIG. 13B is a schematic diagram showing the variation of electric field in the depth direction of the pillar region in the semiconductor device.

When the amount of dopant in the pillar region of the device section is continuously varied in the depth direction, the drift portion of the electric field distribution during application of high voltage has a saddle-shaped (mound-shaped) distribution as indicated by a solid line in FIG. 13B. On the other hand, when the amount of dopant is constant in the depth direction, the electric field distribution exhibits a rectangular shape as indicated by a dotted line in FIG. 13B. Therefore the decrease of breakdown voltage associated with continuously varying the amount of dopant in the pillar region in the depth direction corresponds to the hatched region in FIG. 13B, which extends nearly across the pillar region in the depth direction.

In contrast, when the amount of dopant in the p-type pillar region 34 is varied stepwise as in the present embodiment, the drift portion of the electric field distribution during application of high voltage has a trapezoidal distribution as indicated by a solid line in FIG. 12B. The decrease of breakdown voltage relative to the amount of dopant being constant in the depth direction corresponds to the hatched region in FIG. 12B, which extends only in the top and the bottom portion of the superjunction structure. Thus the decrease of breakdown voltage can be reduced relative to the configuration where the amount of dopant in the pillar region is continuously varied in the depth direction That is, in the configuration of this embodiment, the maximum breakdown voltage can be increased relative to the configuration where the amount of dopant in the pillar region is continuously varied in the depth direction. Thus the process margin can be increased.

Figures 14A, 14B:
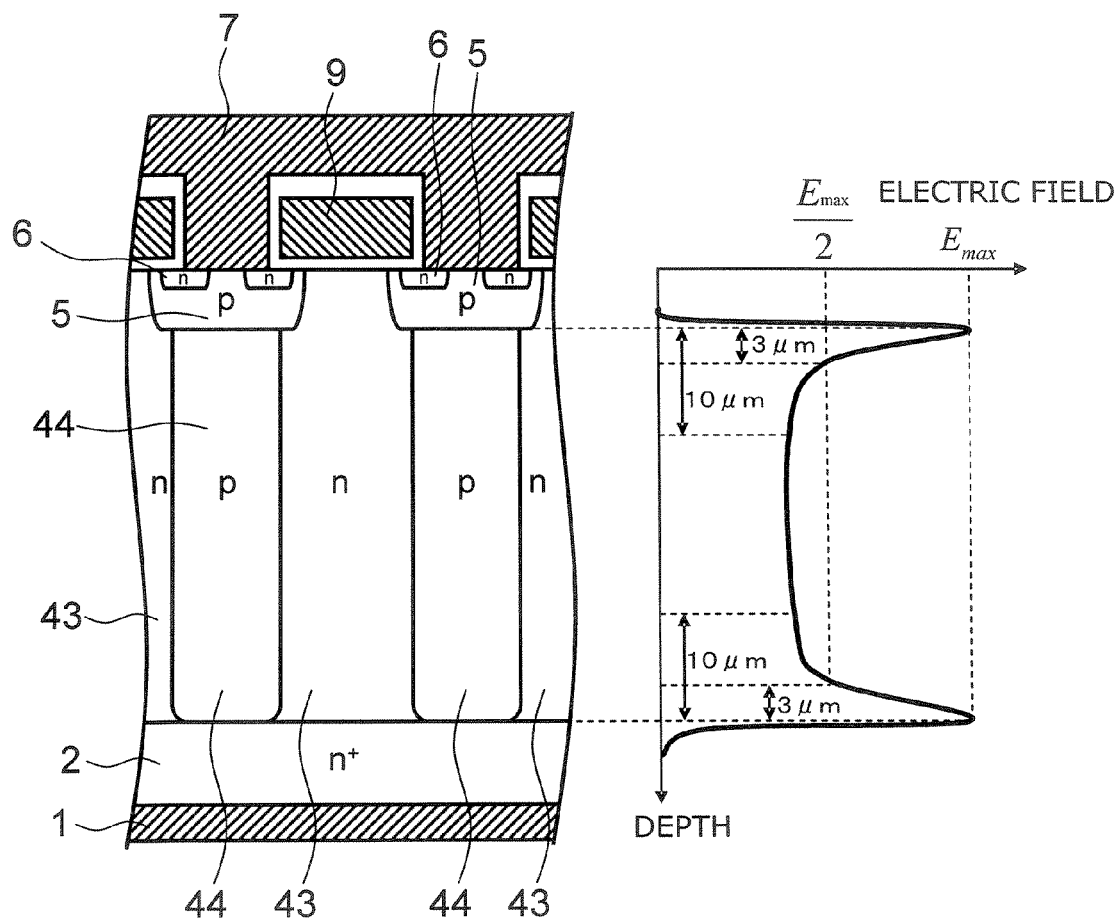
FIG. 14 schematically illustrates the cross-sectional structure of the main part of a semiconductor device and the variation of electric field in the depth direction of the pillar region where the amount of dopant in the pillar region is uniform in the depth direction.

FIG. 14A shows the cross-sectional structure of the main part of a semiconductor device where the amount of dopant in the n-type pillar region 43 and the p-type pillar region 44 of the device section is uniform in the depth direction, and FIG. 14B is a schematic diagram showing the variation of electric field in the depth direction of the drift portion (n-type pillar region 43) in the semiconductor device.

In power MOSFETs, for example, it is required to prevent the decrease of breakdown voltage and to ensure high avalanche withstand capability. The avalanche withstand capability is determined by the electric field distribution in the drift portion during application of high voltage. When an avalanche breakdown occurs due to application of high voltage, electrons and holes are generated in the drift portion. The number of electrons is larger on the drain side, and the number of holes is larger on the source side. When the amount of carriers exceeds a certain level, the distribution of potential is varied. Thus the electric field distribution in the drift portion has peaks (Emax) in the top portion on the source electrode 7 side and in the bottom portion on the drain electrode 1 side as shown in FIG. 14B.

When the electric field distribution is thus varied by carriers generated by avalanche breakdown, impact ionization on the drain side and the source side is further accelerated, and the electric field peak is further enhanced. Then the electric field at the center of the drift portion is decreased. That is, negative resistance occurs where the retained voltage decreases while the avalanche-induced current increases.

The occurrence of such negative resistance tends to induce current concentration, which is likely to result in device destruction. Thus, to enhance avalanche withstand capability, it is necessary to prevent the occurrence of negative resistance. To this end, it is effective to prevent the occurrence of electric field peaks on the drain side and the source side.

The electric field peaks on the drain side and the source side occur in the vicinity of the base region 5 and the $n^+$-drain layer 2. Hence, to reduce the electric field in these regions, the amount of dopant in the p-type pillar region 34 is made larger than the amount of dopant in the n-type pillar region 33 in the top portion on the source electrode 7 side, and the amount of dopant in the n-type pillar region 33 is made larger than the amount of dopant in the p-type pillar region 34 in the bottom portion on the drain electrode 1 side. Thus the avalanche withstand capability can be enhanced.

The amount of dopant in the top and bottom portion of the p-type pillar region 34 may be varied whereas the amount of dopant in the n-type pillar region 33 is constant in the depth direction Conversely, the amount of dopant in the top and bottom portion of the n-type pillar region 33 may be varied whereas the amount of dopant in the p-type pillar region 34 is constant in the depth direction. Alternatively, the amount of dopant in the top and bottom portion of both the n-type pillar region 33 and the p-type pillar region 34 may be varied Furthermore, in the portion between the top and the bottom portion of the superjunction structure, the amount of dopant in the n-type pillar region 33 is made generally equal to the amount of dopant in the p-type pillar region 34. Thus the decrease of the maximum breakdown voltage is prevented, and a high breakdown voltage can also be achieved.

As shown in FIG. 14B, the electric field varied by carriers generated by avalanche breakdown is decreased to half (Emax/2) at about 3 μm below the base region 5 and at about 3 μm above the $n^+$-drain layer 2, and is comparable to the center level at about 10 μm below the base region 5 and at about 10 μm above the $n^+$-drain layer 2. Therefore it is preferable to assign the portion of 3 to 10 μm below the base region 5 as the top portion where the amount of dopant in the p-type pillar region 34 is made larger than the amount of dopant in the n-type pillar region 33, and it is preferable to assign the portion of 3 to 10 µm above the n$^+$-drain layer 2 as the bottom portion where the amount of dopant in the n-type pillar region 33 is made larger than the amount of dopant in the p-type pillar region 34.

For example, when the superjunction structure is formed by repeating ion implantation and buried crystal growth, the configuration of this embodiment can be obtained by varying the dopant concentration in the first and last buried crystal growth layer. The variation of dopant concentration is preferably such that the dopant concentration in the top and bottom portion is about 5 to 40% higher or lower than the dopant concentration in the center portion.

Figure 15:
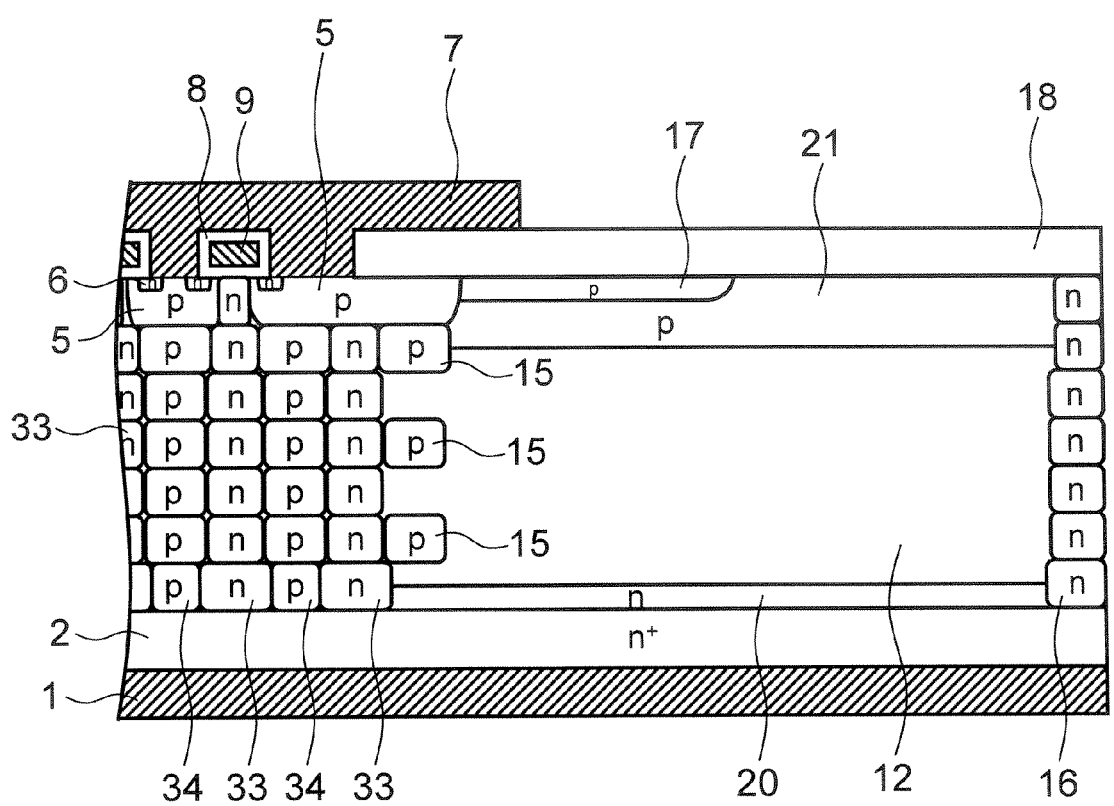
FIG. 15 is a schematic cross-sectional view illustrating a method for manufacturing a semiconductor device according to the fifth embodiment of the invention.

FIG. 15 shows an example cross-sectional structure including the structure of the terminal section in addition to the device section shown in FIG. 12A.

In this example, the terminal section has no superjunction structure. Thus it is possible to prevent the decrease of breakdown voltage in the terminal section due to the fluctuation of the amount of dopant. Furthermore, like the third embodiment, the p-type region 21 formed in the top portion of the terminal section and the n-type region 20 formed in the bottom portion of the terminal section can prevent electric field peaks from occurring at the top and bottom end of the terminal section as well, and the avalanche withstand capability can be enhanced.

If the p-type region 21 is formed to extend to the dicing line, the depletion layer during application of high voltage may reach the dicing line and induce the decrease of reliability such as generation of leak current and variation of breakdown voltage. To prevent this, an n-type field stop layer 16 is provided in the chip terminal.

Sixth Embodiment

Figure 16:
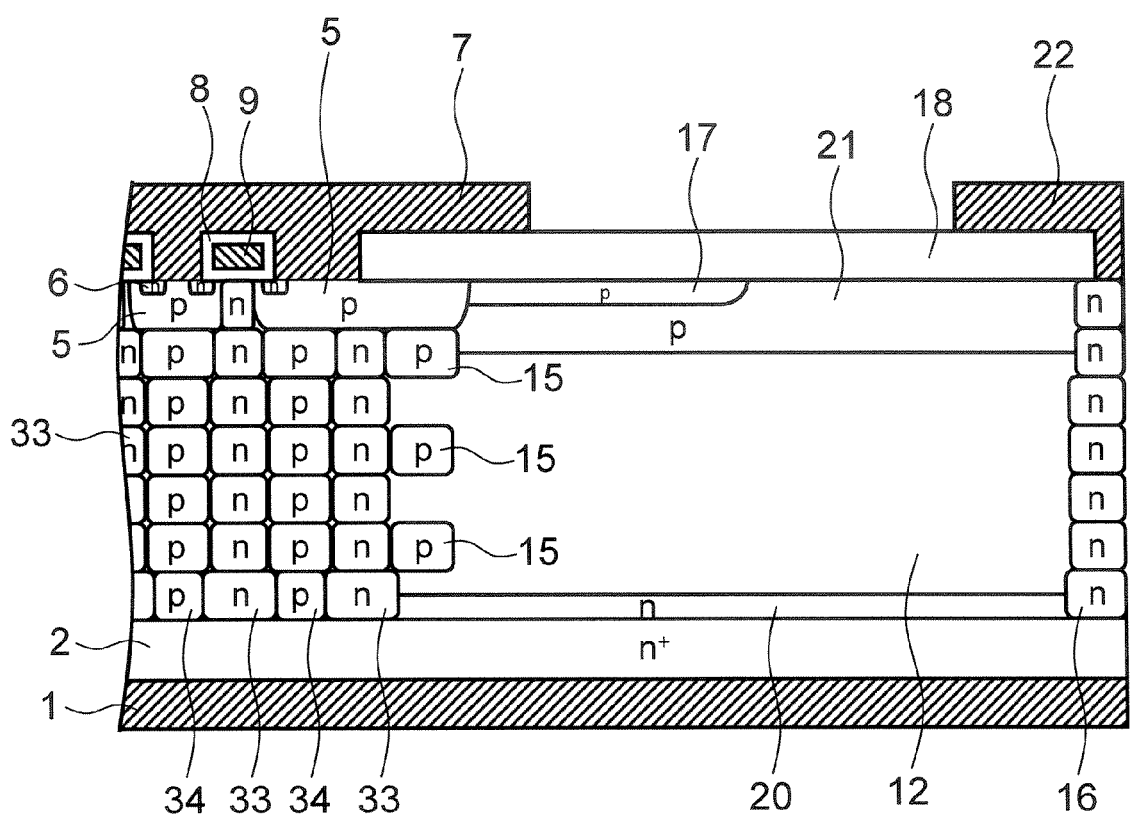
FIG. 16 is a schematic cross-sectional view illustrating the cross-sectional structure of the main part of a semiconductor device according to a sixth embodiment of the invention.

FIG. 16 is a schematic cross-sectional view illustrating the cross-sectional structure of the main part of a semiconductor device according to a sixth embodiment of the invention.

In addition to the configuration shown in FIG. 15, this embodiment includes a field stop electrode 22 connected to the field stop layer 16, thereby ensuring that the depletion layer is prevented from reaching the dicing line.

Seventh Embodiment

Figure 17:
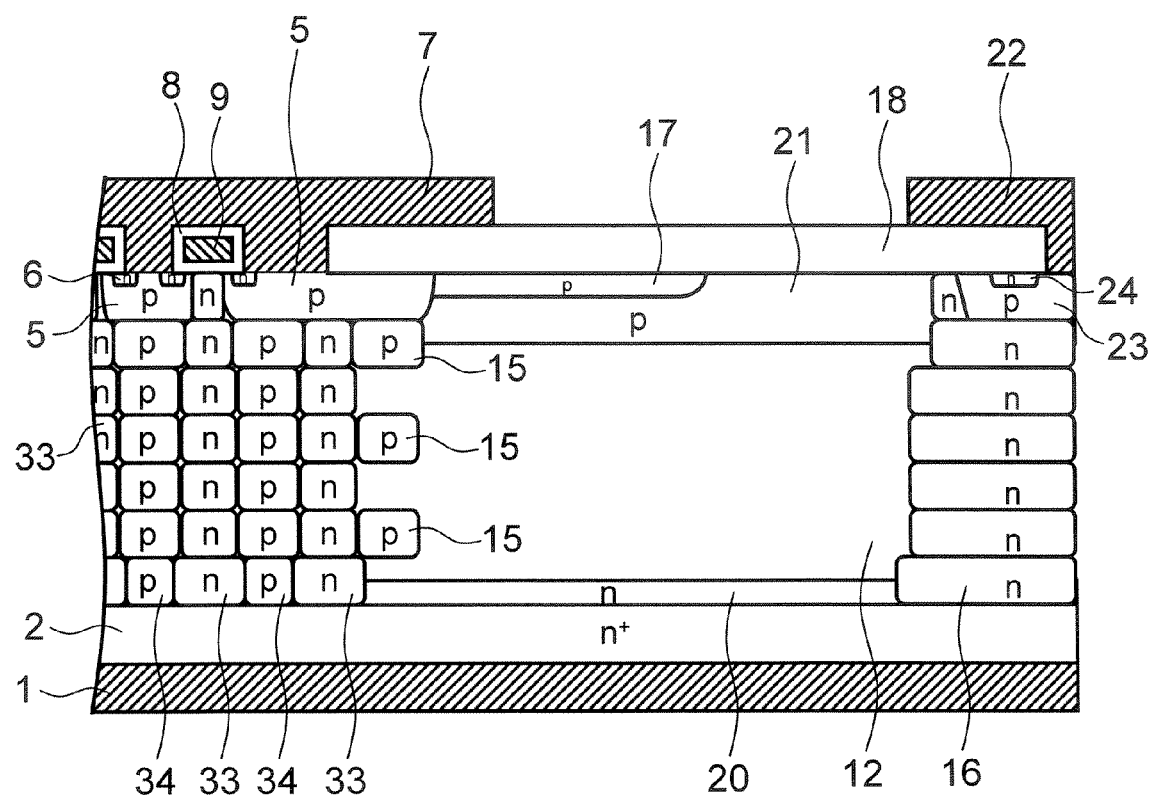
FIG. 17 is a schematic cross-sectional view illustrating the cross-sectional structure of the main part of a semiconductor device according to a seventh embodiment of the invention.

FIG. 17 is a schematic cross-sectional view illustrating the cross-sectional structure of the main part of a semiconductor device according to a seventh embodiment of the invention.

In this embodiment, a p-type field stop region 23 formed simultaneously with the base region 5 and an n-type field stop region 24 formed simultaneously with the source region 6 are provided on the field stop layer 16. The field stop regions 23, 24 are connected to the field stop electrode 22.

Eighth Embodiment

Figure 18:
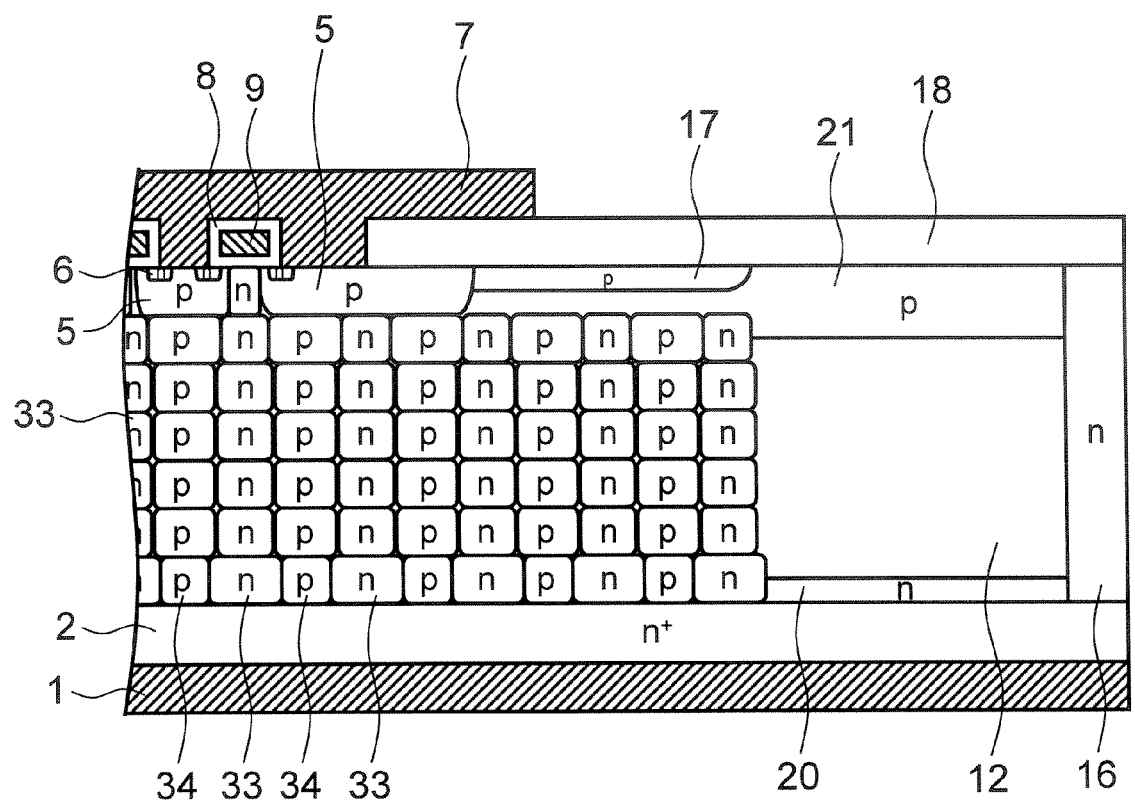
FIG. 18 is a schematic cross-sectional view illustrating the cross-sectional structure of the main part of a semiconductor device according to an eighth embodiment of the invention.

FIG. 18 is a schematic cross-sectional view illustrating the cross-sectional structure of the main part of a semiconductor device according to an eighth embodiment of the invention.

In this embodiment, like the device section, the terminal section also has a superjunction structure where the amount of dopant in the p-type pillar region 34 is larger than the amount of dopant in the n-type pillar region 33 in the top portion, the amount of dopant in the n-type pillar region 33 is larger than the amount of dopant in the p-type pillar region 34 in the bottom portion, and the amount of dopant in the n-type pillar region 33 is generally equal to the amount of dopant in the p-type pillar region 34 in the portion between the top and the bottom portion.

When the terminal section has a superjunction structure, the breakdown voltage of the terminal section may be decreased due to the fluctuation of the amount of dopant between the pillar regions 33 and 34. However, in the superjunction structure of this embodiment, as described above with reference to FIG. 12, the amount of dopant is varied stepwise in the depth direction to prevent the decrease of the maximum breakdown voltage. This facilitates obtaining a high breakdown voltage as compared with the second comparative example (FIG. 4) where the amount of dopant in the superjunction structure of the terminal section is continuously varied in the depth direction. Furthermore, the narrowing of process margin can also be prevented.

Furthermore, by forming a superjunction structure in the terminal section, a high breakdown voltage can be achieved without decreasing the amount of dopant in the outermost p-type pillar region 15 shown in FIGS. 15 to 17 to half the amount of dopant in the p-type pillar region 34. When a RESURF region 17 is provided on the surface of the terminal section, the superjunction structure is preferably formed below the RESURF region 17.

Ninth Embodiment

Figure 19:
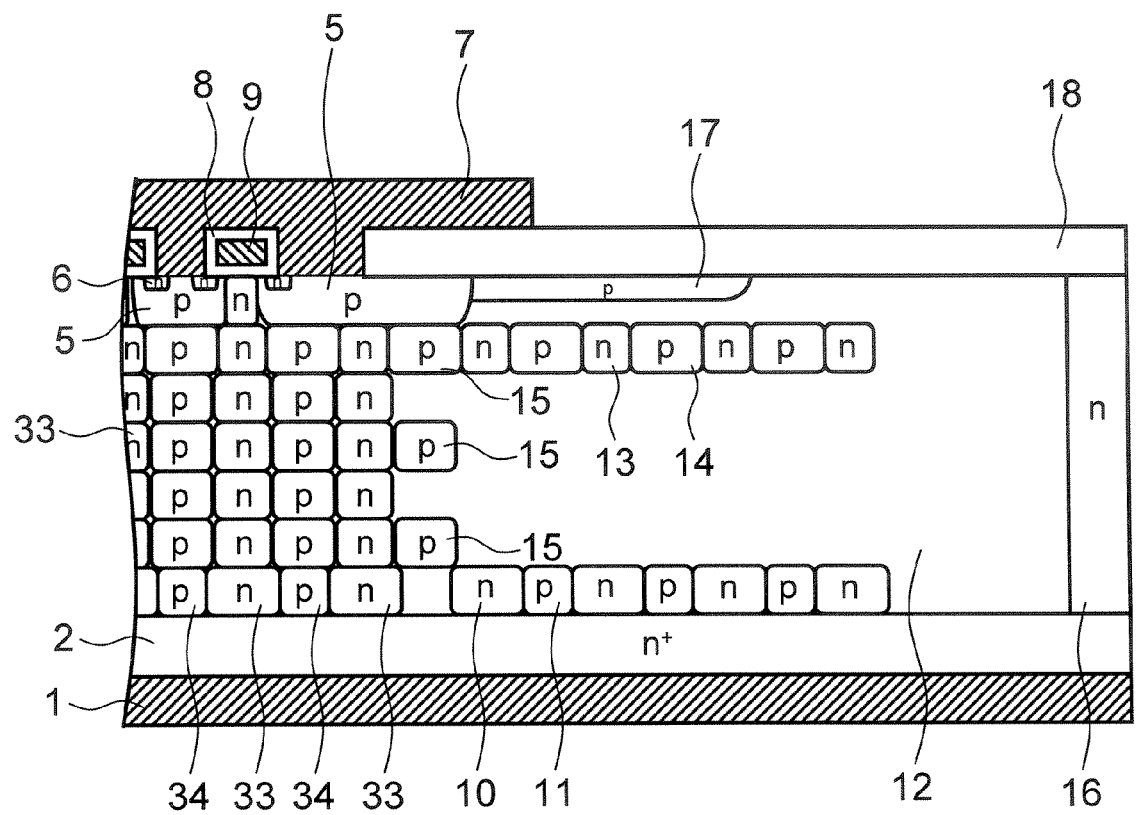
FIG. 19 is a schematic cross-sectional view illustrating the cross-sectional structure of the main part of a semiconductor device according to a ninth embodiment of the invention.

FIG. 19 is a schematic cross-sectional view illustrating the cross-sectional structure of the main part of a semiconductor device according to a ninth embodiment of the invention.

In this embodiment, the device section has a superjunction structure made of n-type pillar regions 33 and p-type pillar regions 34 like the fifth embodiment. The terminal section has terminal bottom n-type regions 10, terminal bottom p-type regions 11, a high resistance semiconductor layer 12, terminal top n-type regions 13, and terminal top p-type regions 14 like the first embodiment.

That is, the amount of p-type dopant is larger in the top portion of the terminal section, and the amount of n-type dopant is larger in the bottom portion of the terminal section. Thus the electric field peaks in the top and bottom portion of the terminal section during application of high voltage can be alleviated, and the avalanche withstand capability can be enhanced. Furthermore, because the superjunction structure is formed not across the depth of the terminal section, it is possible to prevent the decrease of breakdown voltage in the terminal section due to the fluctuation of the amount of p-type and n-type dopant.

Tenth Embodiment

Figure 20:
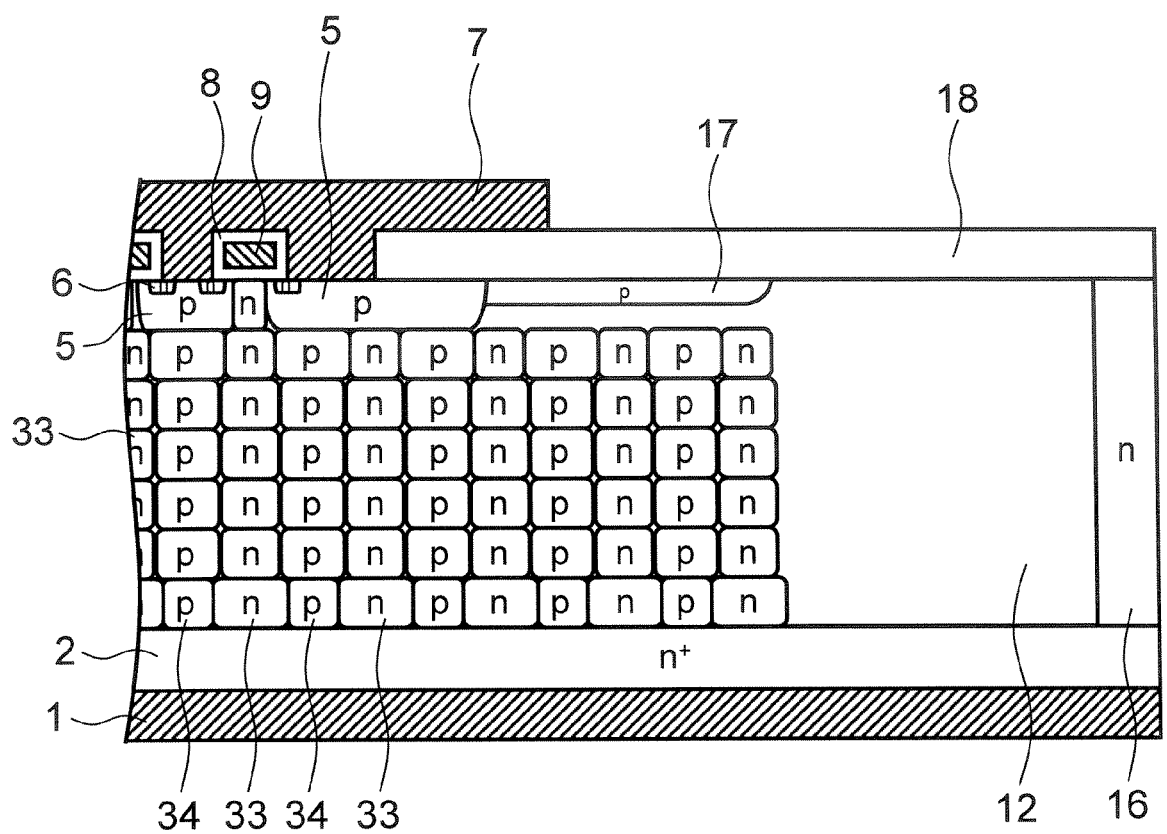
FIG. 20 is a schematic cross-sectional view illustrating the cross-sectional structure of the main part of a semiconductor device according to a tenth embodiment of the invention.

FIG. 20 is a schematic cross-sectional view illustrating the cross-sectional structure of the main part of a semiconductor device according to a tenth embodiment of the invention.

This embodiment is different from the eighth embodiment shown in FIG. 18 in that the terminal bottom n-type region 20 and the terminal top n-type region 20 are not provided. In this embodiment again, the amount of dopant in the superjunction structure is varied stepwise in the depth direction to prevent the decrease of the maximum breakdown voltage. This facilitates obtaining a high breakdown voltage as compared with the second comparative example (FIG. 4) where the amount of dopant in the superjunction structure of the terminal section is continuously varied in the depth direction. Furthermore, the narrowing of process margin can also be prevented.

The superjunction structure made of n-type pillar regions 33 and p-type pillar regions 34 where the amount of dopant is varied stepwise in the depth direction can be obtained by, for example, a process of repeating ion implantation and buried crystal growth, where the first and last dose amount are varied and the dopant concentration of the growth layer is made constant. Note that it is also possible to vary the dose amount and the dopant concentration until the second or third iteration of the above repeating process. Furthermore, the number of iterations of the repeating process is not limited to the number of iterations shown in the figure.

While the terminal structure in the configuration shown in FIGS. 15 to 20 has a RESURF region 17, the terminal structure may have a field plate electrode 19 as shown in FIGS. 8 and 11.

Eleventh Embodiment

Figures 21A, 21B:
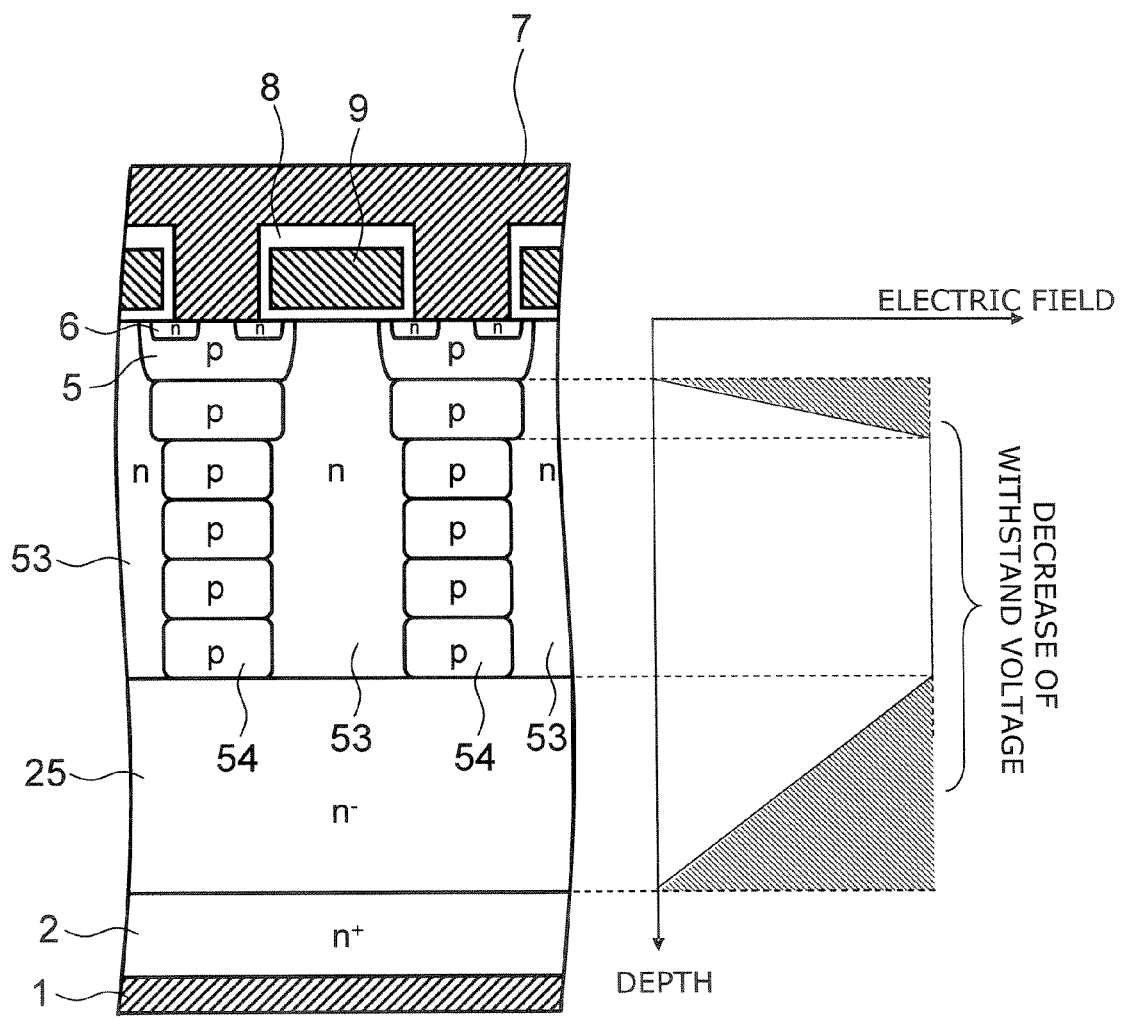
FIG. 21 schematically illustrates the cross-sectional structure of the main part of a semiconductor device and the variation of electric field in the depth direction of the pillar region according to an eleventh embodiment of the invention.

FIG. 21A shows the cross-sectional structure of the main part of a semiconductor device according to an eleventh embodiment of the invention, and FIG. 21B is a schematic diagram showing the variation of electric field in the depth (thickness) direction of the pillar region in the semiconductor device.

In this embodiment, on the major surface of an $n^+$-type layer 2 serving as a first semiconductor layer, an $n^-$-type layer 25 is provided as a second semiconductor layer. A superjunction structure made of n-type pillar regions 53 and p-type pillar regions 54 is provided on the $n^-$-type layer 25. The amount of dopant in the $n^-$-type layer 25 is smaller than the amount of dopant in the $n^+$-type layer 2, the n-type pillar region 53, and the p-type pillar region 54 The $n^-$-type layer 25 has a higher resistance than the $n^+$-type layer 2, the n-type pillar region 53, and the p-type pillar region 54.

As shown in FIG. 21B, the electric field in the $n^-$-type layer 25 decreases on the drain electrode 1 side. Therefore the electric field on the drain electrode 1 side can be decreased even without varying the amount of dopant in the bottom portion of the superjunction structure.

Thus, in order to decrease the electric field in the top portion of the superjunction structure, it is sufficient to make the amount of dopant in the p-type pillar region 54 larger than the amount of dopant in the n-type pillar region 53 only in the top portion of the superjunction structure. Below this portion, the amount of dopant in the p-type pillar region 54 is preferably equal to that in the n-type pillar region 53.

The electric field distribution in the superjunction structure is determined by the difference between the amount of dopant in the n-type pillar region 53 and the amount of dopant in the p-type pillar region 54 Therefore the amount of dopant may be varied in the top portion of both the n-type pillar region 53 and the p-type pillar region 54, or only the amount of dopant in one type of the pillar regions may be varied in the top portion while the amount of dopant in the other type of the pillar regions is left uniform in the thickness direction. The "amount of dopant" used herein refers to the amount of dopant contained in the pillar region and equals the product of the dopant concentration [$cm^{-3}$] and the cross-sectional area of the pillar region [$cm^2$]. Therefore it is sufficient to vary at least one of the dopant concentration and the cross-sectional area of the pillar region in the top portion.

For example, when the dopant concentration is made higher only in the top portion of the p-type pillar region 54 than in the n-type pillar region 53, the dopant concentration in the top portion of the p-type pillar region 54 is preferably 5 to 40% higher than the dopant concentration in the other portions.

Furthermore, like the fifth embodiment, it is preferable to assign the portion of 3 to 10 μm below the base region 5 as the top portion where the amount of dopant in the p-type pillar region 54 is larger than the amount of dopant in the n-type pillar region 53.

Twelfth Embodiment

Figure 22:
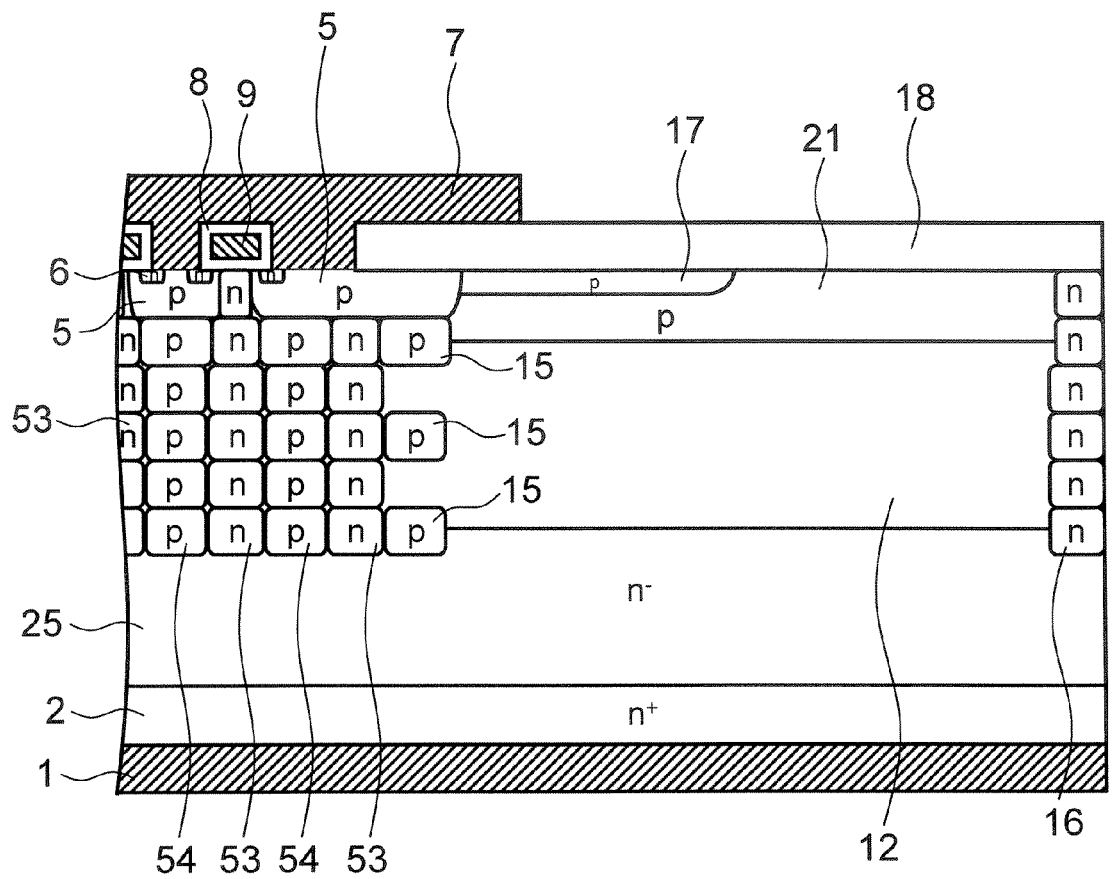
FIG. 22 is a schematic cross-sectional view illustrating the cross-sectional structure of the main part of a semiconductor device according to a twelfth embodiment of the invention.

FIG. 22 is a schematic cross-sectional view illustrating the cross-sectional structure of the main part of a semiconductor device according to a twelfth embodiment of the invention.

FIG. 22 illustrates a semiconductor device having the device section of the structure described above with reference to FIG. 21A, where the structure of the terminal section is also illustrated. The terminal section has a high resistance semiconductor layer 12 on the $n^-$-type layer 25. A terminal top p-type region 21 is provided on the high resistance semiconductor layer 12. A p-type RESURF region 17 is provided on the surface of the terminal top p-type region 21.

According to this embodiment, the $n^-$-type layer 25 and the terminal top p-type region 21 can prevent the increase of electric field in the bottom and top portion of the terminal section, and the avalanche withstand capability can be enhanced. Furthermore, because the terminal section has no superjunction structure, the decrease of breakdown voltage due to charge imbalance can be prevented.

Thirteenth Embodiment

Figure 23:
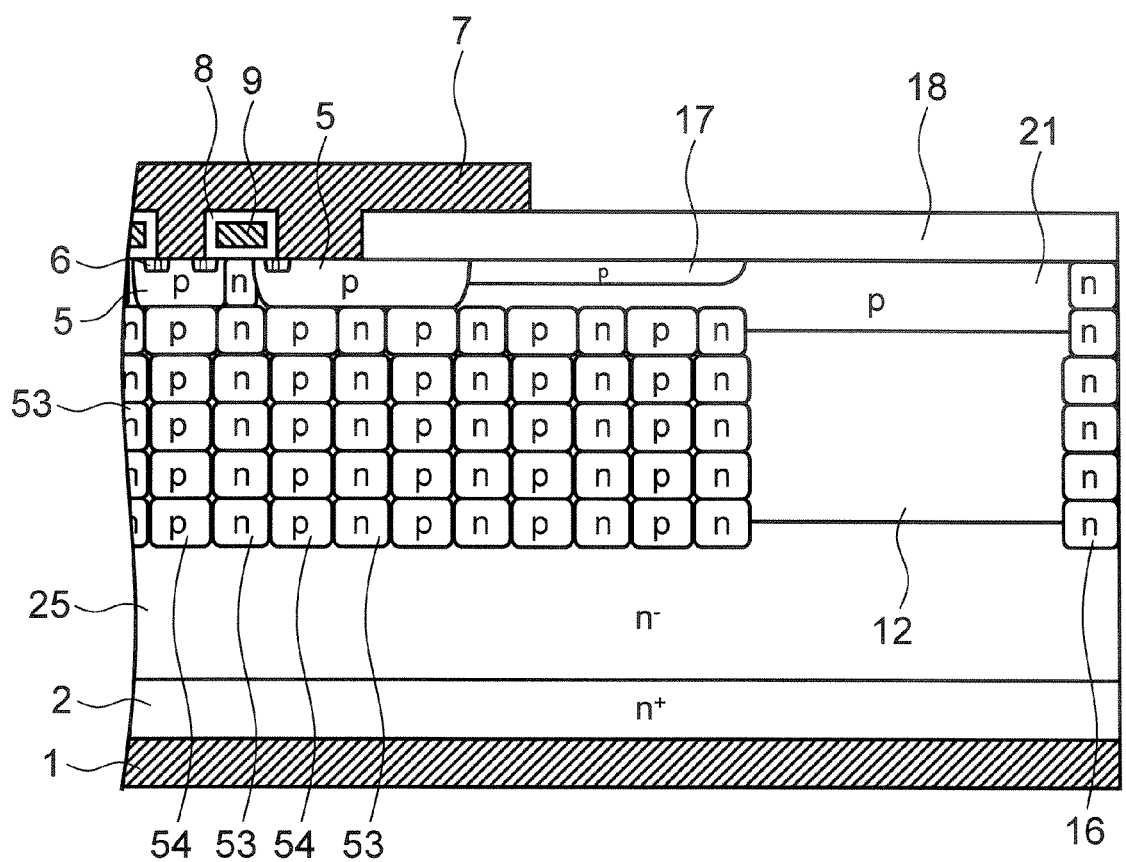
FIG. 23 is a schematic cross-sectional view illustrating the cross-sectional structure of the main part of a semiconductor device according to a thirteenth embodiment of the invention.

FIG. 23 is a schematic cross-sectional view illustrating the cross-sectional structure of the main part of a semiconductor device according to a thirteenth embodiment of the invention.

This embodiment is different from the twelfth embodiment shown in FIG. 22 in that, like the device section, the terminal section also has a superjunction structure made of n-type pillar regions 53 and p-type pillar regions 54.

In this embodiment, the amount of dopant is varied only in the top portion of the superjunction structure. That is, in a top portion of the n-type pillar regions 52 and the p-type pillar regions 54 provided in the terminal section, an amount of dopant in the n-type pillar regions 53 is smaller than an amount of dopant in the p-type pillar regions 54. In a portion except the top portion of the n-type pillar regions 53 and the p-type pillar regions 54, the amount of dopant in the n-type pillar regions is substantially equal to the amount of dopant in the p-type pillar regions 54.

Thus the decrease of the maximum breakdown voltage in the superjunction structure of the terminal portion is confined to the top portion. This facilitates obtaining a high breakdown voltage as compared with the second comparative example (FIG. 4) where the amount of dopant in the superjunction structure of the terminal section is continuously varied in the depth direction. Furthermore, the narrowing of process margin can also be prevented.

As described with reference to FIG. 14B, it is preferable to assign the portion of 3 to 10 μm below the base region 5 as the top portion where the amount of dopant in the p-type pillar region 54 is made larger than the amount of dopant in the n-type pillar region 53.

For example, when the superjunction structure is formed by repeating ion implantation and buried crystal growth, the configuration of this embodiment can be obtained by varying the dopant concentration in the first and last buried crystal growth layer. The variation of dopant concentration is preferably such that the dopant concentration in the top and bottom portion is about 5 to 40% higher or lower than the dopant concentration in the center portion.

Furthermore, by forming a superjunction structure in the terminal section, a high breakdown voltage can be achieved without decreasing the amount of dopant in the outermost p-type pillar region 15 shown in FIGS. 15 to 17 to half the amount of dopant in the p-type pillar region 54. When a RESURF region 17 is provided on the surface of the terminal section, the superjunction structure is preferably formed below the RESURF region 17.

Embodiments of the invention have been described with reference to specific examples. However, the invention is not limited thereto, but the embodiments can be variously modified within the spirit of the invention.

While the foregoing examples assume the first conductivity type as n-type and the second conductivity type as p-type, the invention can also be practiced assuming the first conductivity type as p-type and the second conductivity type as n-type.

The planar pattern of the MOS gate structure and the superjunction structure is not limited to the striped configuration, but may be in a lattice or staggered configuration.

The MOS gate structure is not limited to a planar gate structure, but may be a trench gate structure.

The superjunction structure can be formed by a method of conducting a plurality of iterations of ion implantation and epitaxial growth, a method of forming a trench followed by buried growth in the trench, or a method of forming a trench followed by ion implantation into the trench sidewall.

The field stop electrode 22 shown in FIGS. 16 and 17 may be provided in a semiconductor device of the configuration shown in the other figures.

The structures shown in the first to fourth embodiment can also be configured so that the thickness of the top and bottom portion of the terminal section where the amount of dopant is varied is set to 3 to 10 μm Thus a high breakdown voltage and a high avalanche withstand capability can be achieved also in these embodiments.

Semiconductor is not limited to silicon For example, compound semiconductors (such as silicon carbide and gallium nitride) or wide bandgap semiconductors such as diamond can be used.

The invention is not limited to application to MOSFET devices, but is also applicable to SBDs (Schottky barrier diodes), hybrid devices of MOSFETs and SBDs, or IGBTs (Insulated Gate Bipolar Transistors)

The invention claimed is:

1. A semiconductor device comprising:
a semiconductor layer of a first conductivity type;
a first semiconductor pillar region of the first conductivity type provided on a major surface of the semiconductor layer;
a second semiconductor pillar region of a second conductivity type provided on the major surface of the semiconductor layer and being adjacent to the first semiconductor pillar region;
a first semiconductor region of the second conductivity type provided on the second semiconductor pillar region;
a second semiconductor region of the first conductivity type selectively provided on a surface of the first semiconductor region;
a first main electrode provided on the first semiconductor region and the second semiconductor region;
an insulating film provided on the first semiconductor pillar region, the first semiconductor region, and the second semiconductor region;
a control electrode provided on the insulating film;
a second main electrode provided on a side opposite to the major surface of the semiconductor layer;
a third semiconductor region of the first conductivity type provided on the major surface of the semiconductor layer and located on a terminal side of the first semiconductor pillar region and the second semiconductor pillar region;
a fourth semiconductor region of the second conductivity type provided on the major surface of the semiconductor layer and located on the terminal side of the first semiconductor pillar region and the second semiconductor pillar region, the fourth semiconductor region being adjacent to the third semiconductor region;
a high resistance semiconductor layer provided on the third semiconductor region and the fourth semiconductor region;
a fifth semiconductor region of the first conductivity type provided on the high resistance semiconductor layer; and
a sixth semiconductor region of the second conductivity type provided on the high resistance semiconductor layer and being adjacent to the fifth semiconductor region,
an amount of dopant in at least one of the first semiconductor pillar region and the second semiconductor pillar region being gradually varied in a direction from the first main electrode to the second main electrode, the amount of dopant in the first semiconductor pillar region being smaller than the amount of dopant in the second semiconductor pillar region on the first main electrode side, and the amount of dopant in the first semiconductor pillar region being larger than the amount of dopant in the second semiconductor pillar region on the second main electrode side.

2. The semiconductor device according to claim 1, wherein the amount of dopant in the third semiconductor region is larger than the amount of dopant in the fourth semiconductor region, and
the amount of dopant in the fifth semiconductor region is smaller than the amount of dopant in the sixth semiconductor region.

3. The semiconductor device according to claim 1, further comprising a seventh semiconductor region provided on the major surface of the semiconductor layer between the first and second semiconductor pillar regions, and the third semiconductor region, wherein
an amount of dopant contained in the seventh semiconductor region is substantially half of the amount of dopant contained in the first or second semiconductor pillar region.

4. The semiconductor device according to claim 1, further comprising a seventh semiconductor region of the first conductivity type provided on the major surface of the semiconductor layer on outside of the fourth semiconductor region, the high resistance semiconductor layer and the sixth semiconductor region.

5. The semiconductor device according to claim 1, wherein the fifth semiconductor region and the sixth semiconductor region are thicker than the first semiconductor region.

6. The semiconductor device according to claim 1, further comprising a seventh semiconductor region of the second conductivity type provided on the fifth and sixth semiconductor regions.

7. The semiconductor device according to claim 1, further comprising:
an insulating film provided on the fifth and sixth semiconductor regions; and a field plate electrode provided on the insulating film, the field plate electrode being connected to one of the first main electrode and the control electrode.

8. A semiconductor device comprising:
a semiconductor layer of a first conductivity type;
a first semiconductor pillar region of the first conductivity type provided on a major surface of the semiconductor layer;
a second semiconductor pillar region of a second conductivity type provided on the major surface of the semiconductor layer and being adjacent to the first semiconductor pillar region;
a first semiconductor region of the second conductivity type provided on the second semiconductor pillar region;
a second semiconductor region of the first conductivity type selectively provided on a surface of the first semiconductor region;
a first main electrode provided on the first semiconductor region and the second semiconductor region;
an insulating film provided on the first semiconductor pillar region, the first semiconductor region, and the second semiconductor region;
a control electrode provided on the insulating film;
a second main electrode provided on a side opposite to the major surface of the semiconductor layer;
a third semiconductor region of the first conductivity type provided on the major surface of the semiconductor layer and located on a terminal side of the first semiconductor pillar region and the second semiconductor pillar region;
a high resistance semiconductor layer provided on the third semiconductor region; and
a fourth semiconductor region of the second conductivity type provided on the high resistance semiconductor layer,
an amount of dopant in at least one of the first semiconductor pillar region and the second semiconductor pillar region being gradually varied in a direction from the first main electrode to the second main electrode, the amount of dopant in the first semiconductor pillar region being smaller than the amount of dopant in the second semiconductor pillar region on the first main electrode side, and the amount of dopant in the first semiconductor pillar region being larger than the amount of dopant in the second semiconductor pillar region on the second main electrode side.

9. The semiconductor device according to claim 8, further comprising a fifth semiconductor region provided on the major surface of the semiconductor layer between the first and second semiconductor pillar regions, and the third semiconductor region, wherein
an amount of dopant contained in the fifth semiconductor region is substantially half of the amount of dopant contained in the first or second semiconductor pillar region.

10. The semiconductor device according to claim 8, further comprising a fifth semiconductor region of the first conductivity type provided on the major surface of the semiconductor layer on outside of the third semiconductor region, the high resistance semiconductor layer and the fourth semiconductor region.

11. The semiconductor device according to claim 8, wherein the fourth semiconductor region is thicker than the first semiconductor region.

12. The semiconductor device according to claim 8, further comprising a fifth semiconductor region of the second conductivity type provided on the fourth semiconductor region.

13. The semiconductor device according to claim 8, further comprising:
an insulating film provided on the fourth semiconductor region; and
a field plate electrode provided on the insulating film, the field plate electrode being connected to one of the first main electrode and the control electrode.

14. A semiconductor device comprising:
a semiconductor layer of a first conductivity type;
a first semiconductor pillar region of the first conductivity type provided on a major surface of the semiconductor layer;
a second semiconductor pillar region of a second conductivity type provided on the major surface of the semiconductor layer and being adjacent to the first semiconductor pillar region;
a first semiconductor region of the second conductivity type provided on the second semiconductor pillar region;
a second semiconductor region of the first conductivity type selectively provided on a surface of the first semiconductor region;
a first main electrode provided on the first semiconductor region and the second semiconductor region;
an insulating film provided on the first semiconductor pillar region, the first semiconductor region, and the second semiconductor region;
a control electrode provided on the insulating film; and
a second main electrode provided on a side opposite to the major surface of the semiconductor layer,
in a top portion of the first semiconductor pillar region and the second semiconductor pillar region on the first main electrode side, an amount of dopant in the first semiconductor pillar region being smaller than an amount of dopant in the second semiconductor pillar region,
in a bottom portion of the first semiconductor pillar region and the second semiconductor pillar region on the second main electrode side, the amount of dopant in the first semiconductor pillar region being larger than the amount of dopant in the second semiconductor pillar region, and
in a portion between the top portion and the bottom portion of the first semiconductor pillar region and the second semiconductor pillar region, the amount of dopant in the first semiconductor pillar region being substantially equal to the amount of dopant in the second semiconductor pillar region.

15. The semiconductor device according to claim 14, wherein
the top portion of the first semiconductor pillar region and the second semiconductor pillar region on the first main electrode side where the amount of dopant in the first semiconductor pillar region is smaller than the amount of dopant in the second semiconductor pillar region has a thickness of 3 μm or more and 10 μm or less from the bottom of the first semiconductor region, and
the bottom portion of the first semiconductor pillar region and the second semiconductor pillar region on the second main electrode side where the amount of dopant in the first semiconductor pillar region is larger than the amount of dopant in the second semiconductor pillar region has a thickness of 3 μm or more and 10 μm or less from the surface of the semiconductor layer.

16. The semiconductor device according to claim 14, further comprising:
- a third semiconductor region of the first conductivity type provided on the major surface of the semiconductor layer and located on a terminal side of the first semiconductor pillar region and the second semiconductor pillar region;
- a high resistance semiconductor layer provided on the third semiconductor region; and
- a fourth semiconductor region of the second conductivity type provided on the high resistance semiconductor layer.

17. The semiconductor device according to claim 16, further comprising a fifth semiconductor region of the first conductivity type provided on the major surface of the semiconductor layer on outside of the third semiconductor region, the high resistance semiconductor layer and the fourth semiconductor region.

18. The semiconductor device according to claim 16, wherein the fourth semiconductor region is thicker than the first semiconductor region.

19. The semiconductor device according to claim 14, further comprising:
- a third semiconductor pillar region of the first conductivity type provided on the major surface of the semiconductor layer and located on a terminal side of the first semiconductor pillar region and the second semiconductor pillar region; and
- a fourth semiconductor pillar region of the second conductivity type provided on the major surface of the semiconductor layer and being adjacent to the third semiconductor pillar region, wherein
- in a top portion of the third semiconductor pillar region and the fourth semiconductor pillar region on the first main electrode side, an amount of dopant in the third semiconductor pillar region is smaller than an amount of dopant in the fourth semiconductor pillar region, and
- in a portion except the top portion of the third semiconductor pillar region and the fourth semiconductor pillar region, the amount of dopant in the third semiconductor pillar region is substantially equal to the amount of dopant in the fourth semiconductor pillar region.

20. The semiconductor device according to claim 19, wherein the top portion of the third semiconductor pillar region and the fourth semiconductor pillar region on the first main electrode side where the amount of dopant in the third semiconductor pillar region is smaller than the amount of dopant in the fourth semiconductor pillar region has a thickness of 3 μm or more and 10 μm or less from the bottom of the third semiconductor region.

* * * * *